United States Patent
Miyakoshi

(10) Patent No.: US 7,923,771 B2
(45) Date of Patent: Apr. 12, 2011

(54) SEMICONDUCTOR DEVICE AND METHOD FOR MANUFACTURING THE SAME

(75) Inventor: Nobuki Miyakoshi, Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 29 days.

(21) Appl. No.: 12/517,479

(22) PCT Filed: Dec. 7, 2007

(86) PCT No.: PCT/JP2007/073676
§ 371 (c)(1),
(2), (4) Date: Jun. 3, 2009

(87) PCT Pub. No.: WO2008/069309
PCT Pub. Date: Jun. 12, 2008

(65) Prior Publication Data
US 2010/0013007 A1    Jan. 21, 2010

(30) Foreign Application Priority Data
Dec. 7, 2006    (JP) .............................. P2006-330270

(51) Int. Cl.
*H01L 29/66* (2006.01)
(52) U.S. Cl. ............ 257/329; 257/E29.262; 257/E21.41
(58) Field of Classification Search .................. 257/329, 257/E29.262, E21.041; 438/268
See application file for complete search history.

(56) References Cited

U.S. PATENT DOCUMENTS

| 6,703,665 B1 | 3/2004 | Nakamura |
| 6,849,880 B1 | 2/2005 | Saito et al. |
| 6,972,458 B2 * | 12/2005 | Suzuki et al. ................. 257/330 |
| 6,982,459 B2 * | 1/2006 | Suzuki et al. ................. 257/329 |
| 2003/0089947 A1 | 5/2003 | Kawaguchi et al. |
| 2007/0069323 A1 | 3/2007 | Kunori et al. |

FOREIGN PATENT DOCUMENTS

| JP | 2001-60685 | 3/2001 |
| JP | 2001-102577 | 4/2001 |
| JP | 2003-152180 | 5/2003 |
| JP | 3484690 | 10/2003 |
| JP | 2005-85990 | 3/2005 |
| WO | 2005/093844 | 3/2005 |

OTHER PUBLICATIONS

International Search Report for PCT/JP2007/073676, mailed Mar. 11, 2008.

* cited by examiner

*Primary Examiner* — Chuong A Luu
*Assistant Examiner* — Nga Doan
(74) *Attorney, Agent, or Firm* — Nixon & Vanderhye P.C.

(57) ABSTRACT

A semiconductor device (10) of the present invention includes: a drift layer (5) that includes a reference concentration layer (4) including an impurity of a first conductive type at a first reference concentration and a low concentration layer (3) provided under the reference concentration layer and including an impurity of the first conductive type at a concentration lower than the first reference concentration; a gate electrode (20) that is formed on an upper surface of the reference concentration layer; a pair of source regions (8a and 8b) that are respectively provided on the reference concentration layer in the vicinity of ends of the gate electrode and include an impurity of the first conductive type at a concentration higher than the first reference concentration.

9 Claims, 23 Drawing Sheets

N⁻/N⁺ Si SUBSTRATE

PHOSPHORUS ION INJECTION

UNDERLYING OXIDE FILM FORMATION
INITIAL DIFFUSION (N-TYPE ADVANCE DIFFUSION)

N-TYPE DIFFUSION IS PROVIDED AT GIVEN DEPTH IN ADVANCE

PHOTO PROCESS
BORON-ION INJECTION RESIST REMOVAL

LONG DIFFUSION

OXIDE FILM ETCHING
GATE OXIDE FILM FORMATION
Poly-Si FORMATION
PHOTO PROCESS

Poly-Si
ETCHING
RESIST REMOVAL

BORON ION INJECTION

OXIDE FILM ETCHING
OXIDE FILM FORMAITON
CHANNEL DIFFUSION

PHOTO PROCESS
ARSENIC ION INJECTION
RESIST REMOVAL

PSG FORMATION
DIFFUSION

PHOTO PROCESS
ETCHING
RESIST REMOVAL

SURFACE ELECTRODE FORMATION
REAR-SURFACE ELECTRODE FORMATION

VDSS=300V

VDSS=300V

VDSS=20V

VDSS=20V

VDSS=300V

VDSS=300V

VDSS=660V

VDSS=660V

SEMICONDUCTOR DEVICE AND METHOD FOR MANUFACTURING THE SAME

This application is the U.S. national phase of International Application No. PCT/JP2007/073676, filed 7 Dec. 2007, which designated the U.S. and claims priority to Japanese Application No. 2006-330270, filed 7 Dec. 2006, the entire contents of each of which are hereby incorporated by reference.

TECHNICAL FIELD

The present invention relates to a semiconductor device and a method for manufacturing the same, and particularly to miniaturization of a field-effect transistor (MOSFET).

Priority is claimed on Japanese Patent Application No. 2006-330270, filed Dec. 7, 2006, the content of which is incorporated herein by reference.

BACKGROUND ART

As shown in FIG. 1 of Patent Document 1, an N-channel field-effect transistor (MOSFET) disclosed in Patent Document 1 as a semiconductor device includes an N− drain layer 22 on an N+ semiconductor substrate 21, opposing P− field relaxation layers 31 on the N− drain layer 22 that are spaced from one another, a P base region 24 that is on the surface of the field relaxation layer 31 and has a higher concentration than that of the field relaxation layer 31, an N+ source region 26 and a highly-concentrated P+ diffusion layer 25 on the surface of the base region, an N connection region 23a having intermediate concentration between the opposing field relaxation layers 31, and an N− connection region 23b on the surface of the N connection region 23a.

The semiconductor device disclosed in Patent Document 1 further includes a gate electrode 27 on a part of the source region 26, the base region 24, the field relaxation layer 31, and the N− connection region 23b through a gate oxide film 28a, a source electrode 29 electrically connected to the source region 26, and a drain electrode 30 under an N+ semiconductor substrate 21.

In the semiconductor device having the above structure, when a control voltage is applied to the gate electrode 27 while a voltage is applied between the source electrode 26 and the drain electrode 30, current flows through the channels on the surfaces of the base region 24 and the field relaxation layer 31 below the gate electrode 27.

Patent Document 1: Japanese Patent Publication No. 3484690

DISCLOSURE OF THE INVENTION

Problems to be Solved by the Invention

However, the conventional semiconductor device has the following structure for a higher withstand voltage. In the conventional semiconductor device, the field relaxation layer 31 for reducing the field concentration due to expansion of a depletion layer is formed covering the entire base region 24 excluding the surface thereof. In other words, the bottom surface and the side surface of the base region 24 are covered in the conventional semiconductor device, and therefore the interval between opposing field relaxation layers 31 is narrow.

In other words, the connection regions 23a and 23b are narrow in width due to the field relaxation layer 31 covering the side surface of the base region 24, causing an increase in the on-resistance of the MOSFET to be formed.

Although it has been considered to widen the connection regions 23a and 23b to reduce the on-resistance, the space between the opposing P− field relaxation layers 31 cannot be narrowed due to the widened connection regions 23a and 23b, making it extremely difficult to miniaturize a MOSFET.

Therefore, the present invention is made in view of the above circumstances, and an object of the present invention is to provide a semiconductor device that can withstand high voltage and achieve miniaturization of a MOSFET.

Means for Solving the Problems

A semiconductor device according to an aspect of the present invention includes: a drift layer that includes a reference concentration layer including an impurity of a first conductive type at a first reference concentration and a low concentration layer provided under the reference concentration layer and including an impurity of the first conductive type at a concentration lower than the first reference concentration; a gate electrode that is formed on an upper surface of the reference concentration layer; a pair of source regions that are respectively provided on the reference concentration layer in the vicinity of both ends of the gate electrode and include an impurity of the first conductive type at a concentration higher than the first reference concentration; a pair of base regions that respectively surround outer surfaces of diffusion layers of the source regions and include an impurity of the second conductive type at a second reference concentration; a source electrode that is electrically connected to the source regions and the base regions; a pair of depletion-layer extension regions that are respectively provided in the reference concentration layer under diffusion layers of the base regions and include an impurity of the second conductive type at a concentration lower than the second reference concentration; a drain layer that is provided on a lower surface of the low concentration layer and includes an impurity of the first conductive type at a concentration higher than the first reference concentration; and a drain electrode that is provided on a lower surface of the drain layer, a voltage being applied between the source electrode and the drain electrode. Lower surfaces of the depletion-layer extension regions are deeper than a boundary between the low concentration layer and the reference concentration layer, and intrude into the low concentration layer.

According to the semiconductor device, a depth between the upper surface of the reference concentration layer and the lower surfaces of the depletion-layer extension regions may be twice that between the upper surface of the reference concentration layer and lower surfaces of the base regions.

According to the semiconductor device, the depletion-layer extension regions may contact with flat portions of lower surfaces of the diffusion layers of the base regions.

According to the semiconductor device, the base regions and the depletion-layer extension regions may be spaced symmetrically with respect to a center position where depletion layers A connect with each other and depletion layers B connect with each other when a reverse bias voltage applied between the source electrode and the drain electrode increases, so that the depletion layers A extends from boundaries between the base regions opposing each other and the reference concentration layer, and the depletion layers B extends from boundaries between the depletion-layer extension layers opposing each other and the reference concentration layer.

According to the semiconductor device, a connection of the depletion layers A and a connection of the depletion layers B may occur before depletion layers C reach the source regions or the drain layer when the reverse bias voltage applied between the source electrode and the drain electrode increases, so that the depletion layers A extends from boundaries between the base regions opposing each other and the reference concentration layer, the depletion layers B extends from boundaries between the depletion-layer extension regions opposing each other and the reference concentration layer, and the depletion layer C extends from boundaries between the depletion-layer extension regions and the low concentration layer.

According to the semiconductor device, the base regions, the depletion-layer extension regions, the reference concentration layer, and the low concentration layer may be formed with widths and impurities sufficient for the depletion layers A, B, and C to extend such that the field strengths in the depletion layers A, B, and C are substantially equal until the field strengths of PN junctions corresponding to the deletion layers A, B, and C reach values at which breakdowns occur.

According to the semiconductor device, a pair of the depletion-layer extension regions may oppose each other with an opposed distance through the drift layer under the gate electrode, and where a reference position is defined at an intermediate position between a center of the opposed distance and an outer end of one of the depletion-layer extension regions opposite to an opposing inner end thereof, the opposing inner end may be formed in the vicinity of the reference position.

According to the semiconductor device, an upper portion of the inner end of the depletion-layer extension regions in contact with the base regions may protrude toward the reference position, and a lower portion thereof in contact with the low concentration layer may protrude toward the outer end.

According to the semiconductor device, inner ends of the depletion-layer extension regions that are opposing through the drift layer may be parallel to each other, and lower portions of the inner ends may be curved.

A method according to an aspect of the present invention is a method of manufacturing a semiconductor device using a semiconductor substrate that includes a drain layer including an impurity of a first conductive type at a given concentration, and a low concentration layer on the drain layer and including an impurity of the first conductive type at a concentration lower than the given concentration. The method includes: injecting an impurity of the first conductive type at a first reference concentration higher than that of the low concentration layer into the low concentration layer; performing thermal treatment to make a reference concentration layer, the reference concentration layer and the low concentration layer forming a drift layer; injecting an impurity of a second conductive type into regions spaced at a given interval in the reference concentration region to form a pair of depletion-layer extension regions; performing thermal treatment for activating the impurity injected into the depletion-layer extension regions; forming an oxide film on the semiconductor substrate; layering a polysilicon layer on the semiconductor substrate to form a gate pattern between the depletion-layer extension regions; injecting an impurity of the second conductive type at a second reference concentration higher than those of the depletion-layer extension regions with the gate pattern serving as a mask for forming a pair of base regions; performing thermal treatment to form the base regions; injecting an impurity of the first conductive type at a concentration higher than the first concentration with the gate pattern serving as a mask for forming a pair of source regions; and performing thermal treatment to form the source regions. Lower surfaces of the depletion-layer extension regions are deeper than a boundary between the low concentration layer and the reference concentration layer, and intrude into the low concentration layer.

According to the method, impurity diffusion surfaces of the source regions may be covered with the base regions, and the depletion-layer extension regions may contact with flat portions of lower surfaces of diffusion layers of the base regions.

According to the method, the depletion-layer extension regions may oppose each other with an opposed distance through the drift layer under the gate electrode, and where a reference position is defined at an intermediate position between a center of the opposed distance and an outer end of one of the depletion-layer extension regions opposite to an opposing inner end thereof, the opposing inner end may be formed in the vicinity of the reference position.

According to the method, the depletion-layer extension regions may be formed by forming a mask pattern in a given shape on the low concentration layer and by ion-injecting an impurity of the second conductive type from openings provided in the mask pattern, and the openings may be positioned apart from the reference position in a direction opposite to the gate pattern by more than half a distance between the center and the reference position.

EFFECTS OF THE INVENTION

In the semiconductor device of the present invention, only the bottom surface of each base region covering the source region is covered with the depletion-layer extension region including the second-conductive-type impurity and having a concentration lower than that of the base region, and the side surface of the base region is not covered with the depletion-layer extension region. Thereby, a spaced interval between the opposing base regions is not narrowed by forming the depletion-layer extension region.

In other words, in the conventional case where a depletion-layer extension region (corresponding to the field relaxation layer of Patent Document 1) is formed on the side surface of a base region, the width of the semiconductor device has to be widened to keep a given spaced distance between the depletion-layer extension regions covering the base regions.

On the other hand, in the case of the semiconductor device of the present invention, a depletion-layer extension region is not formed on the side surface of the diffusion layer of the base region, in other words, in the lateral direction of the opposing base regions, and therefore the spaced interval between the opposing source regions can be miniaturized in comparison to the conventional case by providing a given spaced interval between the opposing base regions.

More specifically, in the case of the present invention, the interval between the base regions covering the source regions can be shortened compared with the conventional case without increasing the on-resistance of the semiconductor device, and thereby the semiconductor device can be miniaturized.

In addition, the depletion-layer extension region may be formed only under the bottom surface of the base region, and is not necessary to be formed covering the side surface of the base region in the semiconductor device of the present invention.

As a result, it is not necessary to widely inject an impurity to be diffused in the present invention. The impurity can be deeply injected with directionality in view of the first reference concentration and the depth. As a diffusion layer having sufficient width, the depletion-layer extension region can be formed immediately under the bottom portion of the diffusion layer of the base region. The depletion layer can extend sufficiently when a reverse bias is applied.

Further, in the semiconductor device of the present invention, the lower surface of the depletion-layer extension region may be deeper than a boundary between the low concentration layer and the reference concentration layer. The depth between the upper surface of the reference concentration layer and the lower surface of the depletion-layer extension region may be more than twice that between the upper surface of the reference concentration layer and the bottom surface of the base region. The depletion-layer extension region may have a lower concentration than that of the base region.

As a result, in the semiconductor device of the present invention, the depletion layer spread from the first and second conductive type junction (PN junction) can extend sufficiently in the depletion-extension region, and thereby the electric field can be relaxed.

Therefore, the semiconductor device of the present invention can prevent a reduction in withstand voltage caused by field concentration by relaxing the electric field.

Figure 1:
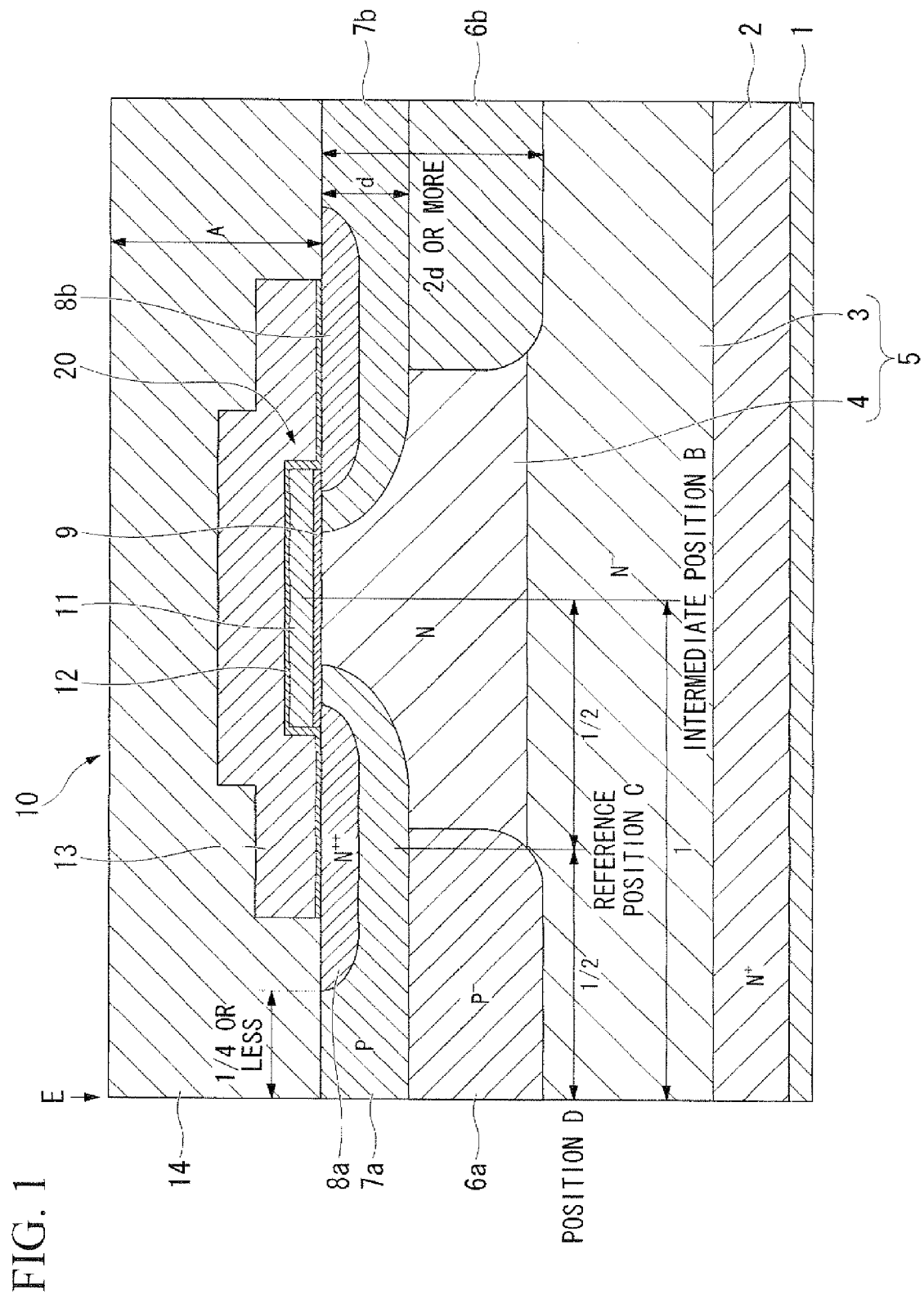
FIG. 1 is a cross-sectional view showing a structure of a semiconductor device.

DESCRIPTIONS OF NUMERALS 1 drain electrode
2 drain layer
3 low concentration layer
4 reference concentration layer
5 drift layer
6a and 6b depletion-layer extension region 7a and 7b base region
8a and 8b source region
9 gate oxide film
10 semiconductor device
11 polysilicon layer
12 oxide layer
13 PSG
14 source electrode
20 gate

BEST MODE FOR CARRYING OUT THE INVENTION

A semiconductor device of the present invention is a MOSFET (filed-effect transistor) and includes multiple MOSFETs arranged in parallel. Each of the MOSFETs arranged in parallel has the same structure, and therefore one of the MOSFETs is explained as an example in the present embodiment.

As shown in FIG. 1, a semiconductor device 10 of the present invention includes a drift layer 5 consisting of a reference concentration layer 4 including an n-type impurity as a first conductive type at a given first reference concentration and a low concentration layer 3 including an n-type impurity having a concentration lower than that of the reference concentration layer 4, and a gate 20 formed on the surface of the reference concentration layer 4. In the vicinity of the surface of the reference concentration layer 4 on which the gate 20 is formed, on the surface of the semiconductor substrate in the vicinity of the opposing end portions of the gate electrode 20, a pair of diffusion regions. i.e., source regions 8a and 8b including an n-type impurity having a concentration higher than the first reference concentration are formed at a given spaced interval.

As diffusion layers covering the source regions 8a and 8b, base regions 7a and 7b including a p-type impurity of a second conductive type at a second reference concentration are formed between each of the source regions 8a and 8b and the low concentration layer 3.

The semiconductor device 10 of the present embodiment further includes depletion-layer extension regions 6a and 6b that are provided in the bottom regions of the diffusion layers of the base regions 7a and 7b and include a p-type impurity at a concentration lower than the second reference concentration. In the case of the diffusion layers of the base regions 7a and 7b, the bottom regions indicate plane regions at the bottom portions of the diffusion layers of the base regions 7a and 7b, which are in parallel with the surface of the semiconductor substrate.

The bottom surface of the diffusion layer of the depletion-layer extension region 6 intrudes into the low concentration layer 3 side with respect to the boundary between the reference concentration layer 4 and the low concentration layer 3. In other words, the bottom surface of the diffusion layer (boundary between the depletion-layer extension region and the low concentration layer 3) is deeper than the boundary between the low concentration layer 3 and the reference concentration layer 4.

A source electrode 14 electrically connects to the source regions 8a and 8b, and the base regions 7a and 7b.

The drain electrode 1 is provided on the back of the semiconductor substrate of the semiconductor device, and a voltage is applied between the drain electrode 1 and the source electrode 14.

In addition, a drain layer 2 including an n-type impurity at a concentration higher than the first reference concentration is provided between the drain electrode 1 and the low concentration layer 3.

In the MOSFET of the present embodiment having the structure explained above, a voltage is applied between the source electrode 14 and the drain electrode 1, and a control voltage is applied to the gate 20. As a result, a channel (inversion layer) is formed in the base region 7 that is adjacent to the source region 8 and covers the source region 8, and current flows between the source electrode 14 and the drain electrode 1 through the drift layer 5 and the drain layer 2.

The reference concentration layer 4 of the drift layer 5 includes an n-type impurity such as phosphorus at a surface concentration of $1\times10^{16}$ cm$^{-3}$ and has a thickness of approximately 6 to 7 μm. The low concentration layer 3 includes an n-type impurity such as phosphorus at a concentration of $3\times10^{14}$ cm$^{-3}$ and has a thickness of approximately 40 μm.

The drain layer 2 includes an n-type impurity such as phosphorus or antimony at a concentration of $1\times10^{20}$ cm$^{-3}$ and has a thickness of approximately 200 to 300 μm.

At the position A, the source electrode 14 is made of material mainly including aluminum and has a thickness of 4 μm, for example.

The drain electrode 1 is made of a multilayer metal film such as Ti—Ni—Ag and has a thickness of 0.5 μm for the entire multilayer metal film, for example.

As shown in FIG. 1, the gate 20 is formed on the surface of the reference concentration layer 4, the position of which corresponds to the position between a pair of the source regions 8 formed in the vicinity of the surface of the reference concentration layer 4.

The gate 20 includes a gate oxide film 9 and a polysilicon layer 11 that are layered sequentially, and an oxide film 12 that is further layered thereon and covers the surfaces thereof. The oxide film 12 covering the surfaces of the gate oxide film 9 and the polysilicon layer 11 layered on the gate oxide film 9 extends on a part of the source region 8. PSG 13 as an interlayer insulating film having insulation is formed on the oxide film 12. Due to the PSG 13, the source electrode 14 explained hereinafter and the gate 20 are prevented from electrically connecting to each other.

For example, the gate oxide film 9 of the gate 20 is 0.1 μm in thickness and the polysilicon layer 11 is 0.5 μm in thickness. For example, the oxide layer 12 is 0.05 μm in thickness and the PSG 13 is 1 μm in thickness.

The source regions 8a (8b) are opposing each other and spaced by approximately 4-6 μm in the vicinity of the surface of the reference concentration layer 4 under the gate 20. The source region 8a (8b) includes an n-type impurity such as arsenic at a surface concentration of $2\times10^{20}$ cm$^{-3}$ and has a depth of approximately 0.3 μm.

The base regions 7a (7b) covering the source regions 8a (8b) are opposing each other through the reference concentration layer 4 of the drift layer 5. The base region 7 includes a p-type impurity such as boron at a surface concentration of $3\times10^{17}$ cm$^{-3}$ and has a depth of approximately 2 to 2.5 μm.

The base regions 7a (7b) and the depletion-layer extension regions 6a (6b) formed under the bottom surface of the base regions 7a (7b) oppose each other through the drift layer 5 immediately below the gate 20. The interval between the base regions 7a and 7b, i.e., the width of the drift layer 5 between the base regions 7a and 7b is defined as the spaced interval (opposed distance) in the following explanation.

One end of the depletion-layer extension region 6a opposing the depletion-layer extension region 6b through the drift layer 5 is positioned in the vicinity of the midpoint (reference position C) between the midpoint of the spaced interval (intermediate position B) and the other end E of the depletion-layer extension region 6a that is not opposing the depletion-layer extension region 6b through the drift layer 5. The end E is a loop point of the multiple MOSFETs that are continuously formed. In other words, the end E is the center of the base region 7a shared between the MOSFET shown in FIG. 1 and an adjacent MOSFET continuously formed on the left side of the MOSFET. Similarly, the base region 7b is shared with another adjacent MOSFET on the right side of the MOSFET shown in FIG. 1.

More specifically, as shown in FIG. 1, when the distance between the midpoint B of the width of the gate 20 and the end of the semiconductor device 10 is 1, the other end of the depletion-layer extension region 6 is positioned in the vicinity of the position C (reference position) at a half of the distance.

More specifically, as shown in FIG. 1 showing the cross section of the semiconductor device, the upper surface of the depletion-layer extension region 6a (6b) formed in the vicinity of the point C under the bottom surface of the base regions 7a (7b) is positioned closer to the inside (in the B-side direction) of the semiconductor device than the position C. The depletion-layer extension region 6a (6b) has a curved portion such that the lower surface thereof is positioned closer to the outside (in the D-side direction) of the semiconductor device 10 than the position C.

In other words, when a voltage is applied between the source electrode 14 and the drain electrode 1 and the MOSFET is in the off-state, a depletion layer extending from the boundary between the base region 7a and the reference concentration layer 4 connects with a depletion layer extending from the boundary between the base region 7b and the reference concentration layer 4 at the intermediate position B. Further, a depletion layer extending from the boundary between the depletion-layer extension region 6a and the reference concentration layer 4 connects with a depletion layer extending from the boundary between the depletion-layer extension region 6b and the reference concentration layer 4 at the intermediate position B.

Preferably, the curved portion at the end of the depletion-layer extension region 6a (6b) is as sharp as possible rather than being dull. More preferably, except for the upper side and the lower side of the depletion-layer extension region 6a (6b), the depletion-layer extension region 6a (6b) should be along the vertical line denoted by the position C shown in FIG. 1 as much as possible, and positioned slightly closer to the inside (in the B-side direction) of the semiconductor device than the position C on the upper surface side, and slightly closer to the outside (in the C-side direction) of the semiconductor device than the position C on the lower surface side in order to have a shape similar to the tip of a Japanese cutting knife and to make the opposing surfaces thereof in parallel with each other.

The depletion-layer extension regions 6a and 6b are formed in the above manner, and thereby the opposed distance between the depletion-layer extension regions 6a and 6b can be widened compared with the conventional structure. Additionally, a region for electrons (carriers) to move can be widened when the MOSFET is in the on-state, and the on-resistance of the MOSFET can be reduced.

Due to the shape explained above, the spaced interval between the depletion-layer extension regions 6a and 6b opposing each other through the drift layer 5 corresponds to that between the curved portions of the diffusion layers forming the depletion-layer extension regions 6a and 6b as shown in FIG. 1. The spaced interval gradually increases with the depth from the upper surface to the lower surface.

The depletion-layer extension region 6a (6b) includes a p-type impurity such as boron at a surface concentration of approximately $7 \times 10^{16}$ to $10 \times 10^{16}$ cm$^{-3}$ and has a depth of approximately 7 to 8 µm.

As shown in FIG. 1, the depth of the depletion-layer extension region 6a (6b) (depth from the upper surface of the reference concentration layer 4 to the bottom surface of the depletion-layer extension region 6) is designed to be more than twice (more than 2d) that of the base region 7 (the depth d from the upper surface of the reference concentration layer 4 to the bottom surface of the base region 7).

Therefore, the depletion-layer extension region 6a (6b) has a sufficient thickness so that depletion layers having sufficient thicknesses extend from the boundary with the low concentration layer 3 toward the base regions 7a and 7b and the low concentration region 3 to enhance withstand voltage at the boundary when a reverse bias is applied between the depletion-layer extension region 6a (6b) and the opposing low concentration layer 3.

In the semiconductor device 10 of the present invention having the structure explained above, an inversion layer is formed in the base regions 7a (7b) to be a back gate at the boundary with the gate 20 when a voltage is applied between the source electrode 14 and the drain electrode 1 and an on-control voltage is applied to the gate electrode, in other words, when a negative voltage (negative potential) is applied to the source electrode 14, a positive voltage (positive potential) is applied to the drain electrode 1, a positive voltage is applied to the gate 20 between the source electrode 14 and the gate 20, and a negative voltage is connected to the source electrode 14.

When the inversion layer is formed while the voltage is applied between the source electrode 14 and the drain electrode 1, electrons supplied from the source electrode 14 sequentially move to the drain electrode 1 through the source region 8a (8b), the inversion layer of the base region 7a (7b), the reference concentration layer 4, the low concentration layer 3, and the drain layer 2, which allows current to flow from the drain electrode 1 to the source electrode 14.

On the other hand, when a voltage is applied between the source electrode 14 and the drain electrode 1 and an off-control voltage is applied to the gate electrode, in other words, when a negative voltage and a positive voltage are respectively applied to the source electrode 14 and the drain electrode 1, and the voltage between the source electrode 14 and the gate 20 is set to zero so that a voltage is not applied between the source electrode 14 and the gate 20, an inversion layer is not formed in the base region 7 at the boundary with the gate 20 since a voltage is not applied to the gate 20.

As a result, the voltage applied between the source electrode 14 and the drain electrode 1 causes depletion layers to be formed at the junctions between the p-type base region 7a (7b) and the n-type drift layer 5 and between the depletion-layer extension region 6a (6b) and the n-type drift layer 5. The depletion layers gradually spread according to the voltage applied between the source electrode 14 and the drain electrode 1. When a voltage greater than a given value is applied therebetween, the reference concentration layer 4 of the drift layer 5 provided between the opposing depletion-layer extension regions 6a (6b) and between the opposing base regions 7a (7b) is filled with the spreading depletion layers. Additionally, the depletion layers are spread in the low concentration layer 3 of the drift layer 5.

The semiconductor device 10 of the present invention includes the depletion-layer extension region 6a (6b) including the p-type impurity at a low concentration and having a sufficient layer thickness. As a result, the semiconductor device 10 of the present invention enhances a withstand voltage compared with the conventional MOSFET when a reverse bias is applied to the source electrode 14 and the drain electrode 1. Therefore, it is an object of the semiconductor device 10 to cause the depletion layer to extend in the depletion-layer extension region 6a (6b) so that increases in the field strength between the depletion-layer extension region 6a (6b) and the low concentration layer 3 and in the field strength between the depletion-layer extension region 6a (6b) and the reference concentration layer 4 are prevented. As explained above, an object of the present invention is not to prevent the depletion layer form spreading as in Patent Document 1. On the contrary, the field strength in the depletion layer is relaxed by extending the spreading distance of the depletion layer in the present invention.

In other words, in order for the depletion layer to extend sufficiently, the depletion-layer extension region 6a (6b) of the present embodiment includes the p-type impurity at a low concentration and has a depth of the diffusion layer twice the distance from the surface of the semiconductor device such as the depth of the base region 7a (7b) compared with the conventional case. As a result, the depletion layer spreading in the depletion-layer extension region 6a (6h) can extend sufficiently to relax the field strength, and the spreading depletion layer can relax the field in the present embodiment. Therefore, the semiconductor device 10 of the present invention can improve the reduction in the withstand voltage caused by field concentration, and thereby achieve preferable withstand voltage properties.

When a reverse bias is applied between the source electrode 14 and the drain electrode 1, a depletion layer (depletion layer C) extends from the boundary between the depletion-layer extension region 6a (6b) and the low concentration layer 3 toward the depletion-layer extension region 6a (6b) and the low concentration layer 3. The depletion layer extends further as the voltage of the reverse bias increases.

At this time, similarly, depletion layers (depletion layers A) extend toward each other from the boundary between the base region 7a and the reference concentration layer 4 and the boundary between the base region 7b and the reference concentration layer 4. Further, depletion layers (depletion layer B) extend toward each other from the boundary between the base region 6a and the reference concentration layer 4 and the boundary between the base region 6b and the reference concentration layer 4. Then, these depletion layers connect together at the intermediate position B.

Therefore, a portion where the electric field is significantly concentrated as in the conventional case is removed, in other words, the field strength of each depletion layer A, B, and C is increased equally, and thereby the withstand voltage of the entire semiconductor device 10 can be increased.

According to the semiconductor device of the present invention, an increase in the field strength of each pn-junction can be substantially equal, and the withstand voltage of the entire semiconductor device can be enhanced without increasing the on-resistance thereof.

The various setting conditions in the structure of the semiconductor device were found by the inventor creating an actual device and repeatedly experimenting with a design rule and concentration as parameters.

Figure 7:
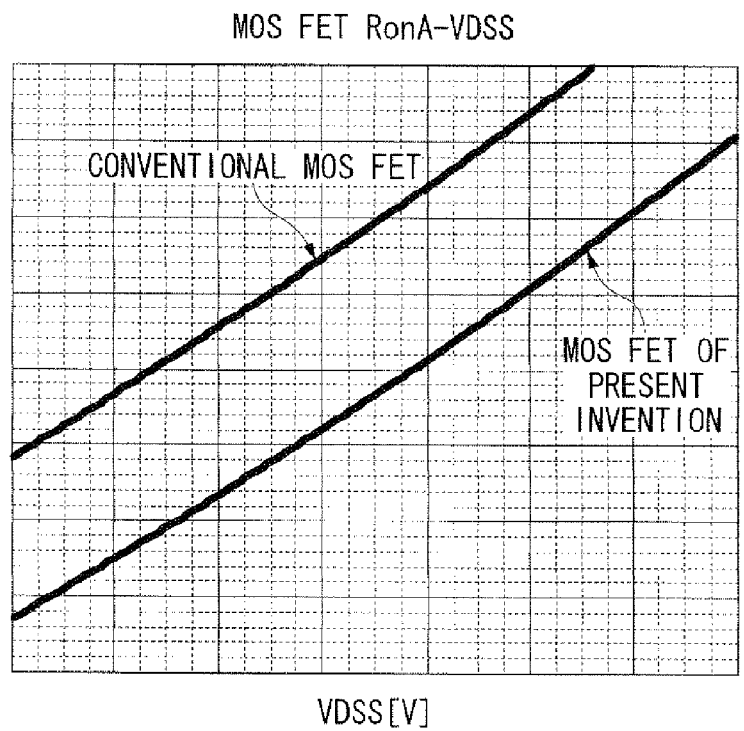
FIG. 7 is a graph showing a performance property comparison of the semiconductor device of the present invention and a conventional semiconductor device.

In the semiconductor device manufactured based on the setting conditions, without covering the side surface of the base region 7a (7b) with the depletion-layer extension region 6a (6b), the maximum voltage that can be applied between the drain and the source (hereinafter, referred to as VDSS) can be higher while the part between the gate and the source is short-circuited, the on-resistance per unit active region (hereinafter, referred to as RonA) can be lower, and therefore preferable properties as shown in FIG. 7 can be attained.

As explained above, in the semiconductor device 10 of the present embodiment different from the conventional semiconductor device in which a depletion-layer extension region (the field relaxation layer of Patent Document 1) is formed on the side surface of the base region, the depletion-layer extension region 6a (6b) is not provided on the opposing ends of the base regions 7a (7b) (including the curved region of the diffusion layer), and thereby the spaced interval between the base regions 7a (7b) covering the source regions 8a (8b) and miniaturization can be achieved without increasing the on-resistance.

In other words, in the semiconductor device 10 of the present embodiment, diffusion regions of the base region, the depletion-layer extension region, the reference concentration layer, and the low concentration layer are formed with a thickness and an impurity concentration such that the depletion layer A extends from the boundary between the base region 7a (7b) and the reference concentration region 4 at the process in which the gate voltage is zero and a reverse bias applied between the source electrode 14 and the drain electrode 1 increases. At the same time, the depletion layer B extends from the boundary between the depletion-layer extension region 6a (6b) and the reference concentration region 4, and the depletion layer C extends from the boundary between the depletion-layer extension region 6a (6b) and the low concentration layer 3. At this time, each depletion layer extends to substantially equalize the field strength in each depletion layer until the field strength of the PN junction corresponding to each depletion layer A, B, and C reaches a value at which a breakdown occurs.

Hereinafter, a method of manufacturing the semiconductor device 10 of the present invention is explained with reference to FIGS. 2 to 6.

Figure 2A:
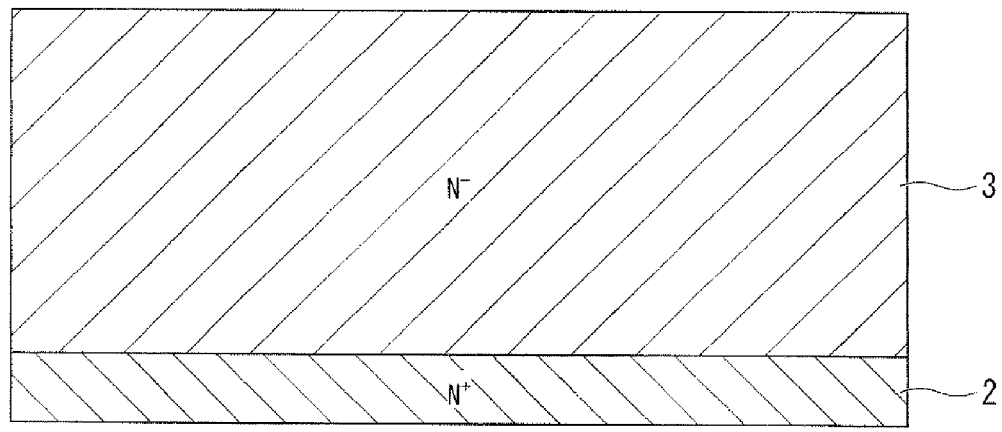
FIG. 2A is a cross-sectional view showing a method of manufacturing the semiconductor device.

A semiconductor substrate that includes a layer including an n-type impurity such as antimony or phosphorus at a concentration of $1 \times 10^{20}$ cm$^{-3}$ and a layer thereon including an n-type impurity such as phosphorus at a concentration of $3 \times 10^{14}$ cm$^{-3}$ is prepared. The lower layer of the prepared semiconductor substrate is for the drain layer 2 and the upper layer thereof is for the drift layer 5. At this stage, the reference concentration layer 4 of the drift layer 5 has not been generated yet (FIG. 2A).

Figure 2B:
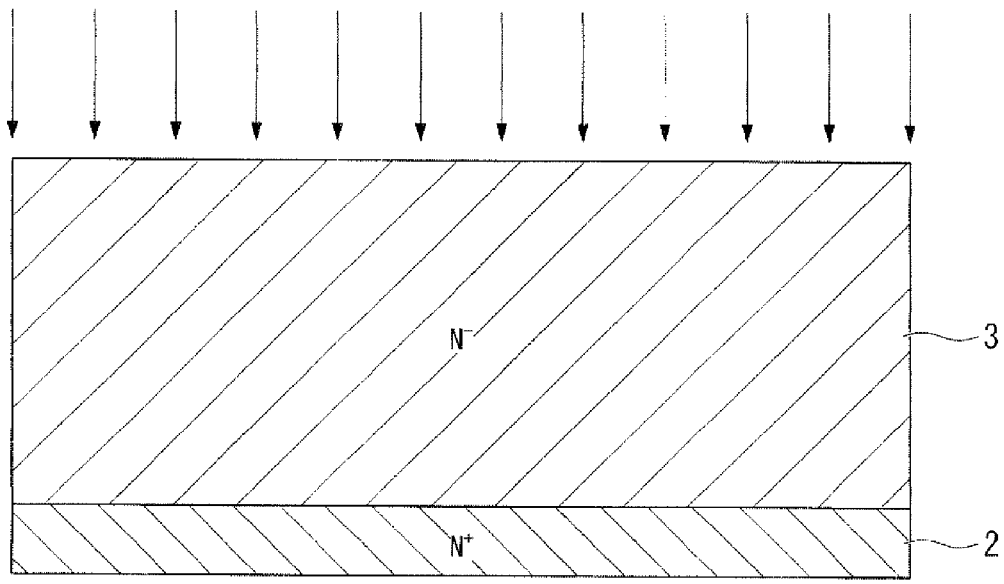
FIG. 2B is a cross-sectional view showing a method of manufacturing the semiconductor device.

The phosphorus of the n-type impurity for forming the reference concentration region 4 shown in FIG. 1 is ion injected to the surface of the prepared semiconductor substrate at the energy of 100 keV according to $2 \times 10^{12}$ to $4 \times 10^{12}$ cm$^{-2}$ (FIG. 2B).

Figure 3A:
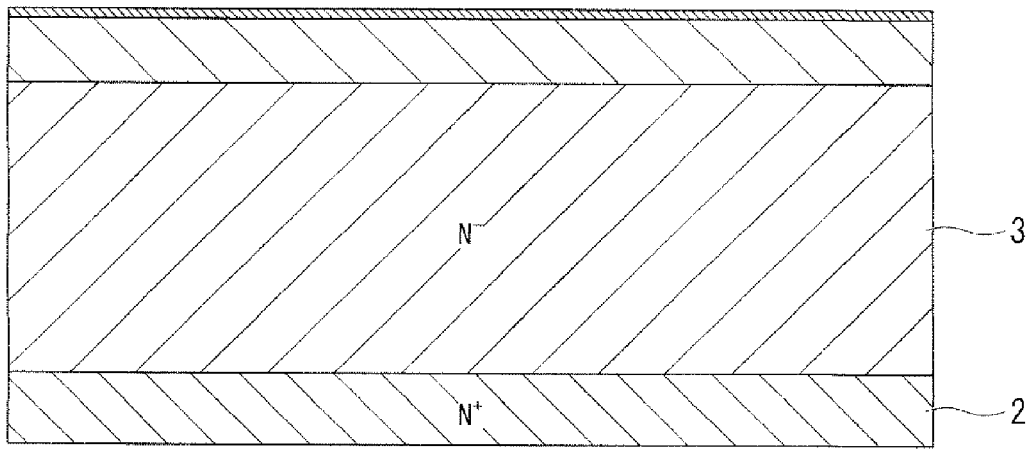
FIG. 3A is a cross-sectional view showing a method of manufacturing the semiconductor device.

After an underlying oxide film is formed, the ion-injected phosphorus is diffused in advance to form a diffusion area having a given depth in advance (FIG. 3A).

A resist is applied to the underlying oxide film, a photolithography is carried out, and an opening pattern for an ion injection is formed.

Figure 3B:
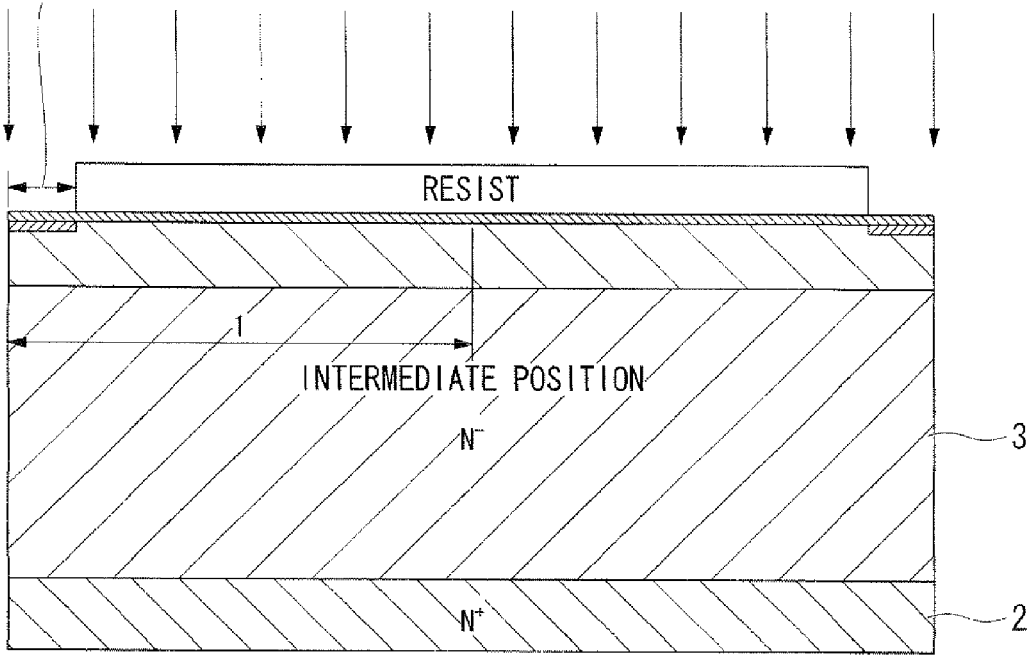
FIG. 3B is a cross-sectional view showing a method of manufacturing the semiconductor device.

The mask pattern is for forming the depletion-layer extension region 6a (6b), and an impurity is ion-injected from the opening of the mask pattern (FIG. 3B). The opening of the mask pattern for the ion injection is formed with the size that is less than given value. Specifically, when the distance between the position B (intermediate position) that is the widthwise center of the gate 20 and the end of the semiconductor device 10 of the present invention shown in FIG. 1 is one, the opening size is less than one forth. In the present embodiment, the mask pattern is formed such that the opening size becomes 0.5 to 2 μm (since the semiconductor devices shown in FIG. 1 are arranged continuously in an actual manufacture as explained already, the corresponding opening size becomes 1 to 4 μm).

The condition that the opening size of the mask pattern for the ion injection is set to less than one fourth has been found by the inventor through repeated experiments.

In other words, the opening of the mask pattern is formed at a position deviated from the position C by more than half the distance between the position B and the reference position C in the direction opposite to the polysilicon layer 11, and thereby a lateral end of an impurity diffusion surface formed by a thermal treatment or the like explained hereinafter can be formed at a position not reaching the curved portion of the diffusion layer of the base region 7.

As a result, the opposed distance between the depletion-layer extension regions 6a and 6b to be formed later is prevented from narrowing unnecessarily, and the on-resist can be maintained.

As explained above, the boron as the p-type impurity for the depletion-layer extension region 6 is ion-injected to regions spaced at a given interval according to $1\times10^{13}$ to $4\times10^{13}$ cm$^{-2}$ with the opening pattern as a mask.

It has been confirmed through repeated experiments that the pattern processing is carried out so that the opening size becomes less than ¼ and an ion injection is carried out with the injection condition, and thereby the depletion-layer extension region 6 formed by the following thermal treatment is formed in a desired shape and preferable properties can be attained.

At the thermal process of activating boron as the impurity for the depletion-layer extension region 6a (6b) that is a p-layer explained hereinafter, a diffusion area of an n-type impurity having a given depth is formed in advance, and thereby diffusion of the p-type impurity in the direction in parallel with the surface of the semiconductor device (lateral direction) can be prevented. As a result, the interval between the depletion-layer extension region 6a and the opposing depletion-layer extension region 6b can be formed with the width according to the design value, and thereby the width of the reference concentration region 4 can be wide compared with the conventional case and the on-resistance of the MOSFET does not increase. Since the boron ion injection volume is approximately ten times the phosphorus ion injection volume, the diffusion speed of the boron is faster than that of the phosphorus, and the depletion-layer extension region 6a (6b) can be diffused deeper than the n-type reference concentration layer 4.

Figure 3C:
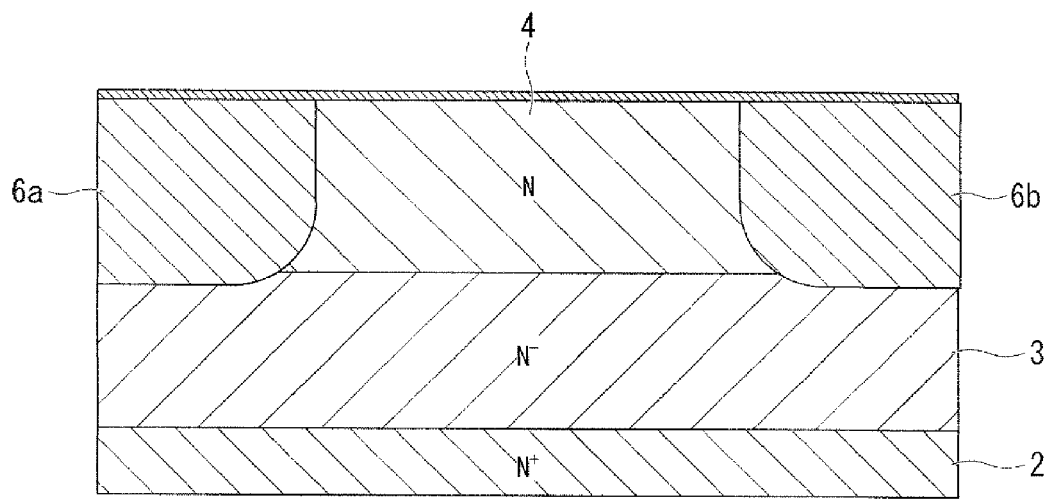
FIG. 3C is a cross-sectional view showing a method of manufacturing the semiconductor device.

Then, long diffusion is carried out for activating the injected impurity. As a result, regions for the reference concentration layer 4 and the depletion-layer extension region 6a (6b) are formed on the semiconductor substrate (FIG. 3C).

The impurity concentration of the reference concentration layer 4 (n layer) is set higher than that of the low concentration layer 3 (n− layer). In addition, the low concentration layer 3 and the reference concentration layer 4 form the drift layer 5 where electrons move in the on-state due to electric field.

After the formed oxide film is removed, a new oxide film to be the gate oxide film 9 is formed, and a polysilicon layer for forming a gate electrode is formed on the new oxide film.

Figure 3D:
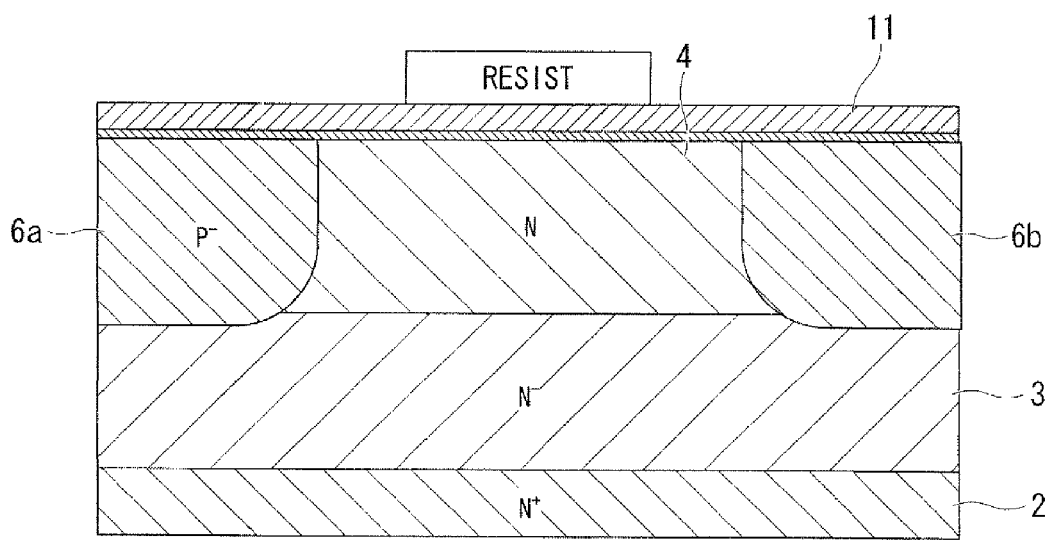
FIG. 3D is a cross-sectional view showing a method of manufacturing the semiconductor device.

Then, a resist is applied to form a gate at a given position, a photolithography (photo process) with a mask forming a gate pattern is carried out, and a resist pattern for etching the polysilicon is formed (FIG. 3D).

Figure 4A:
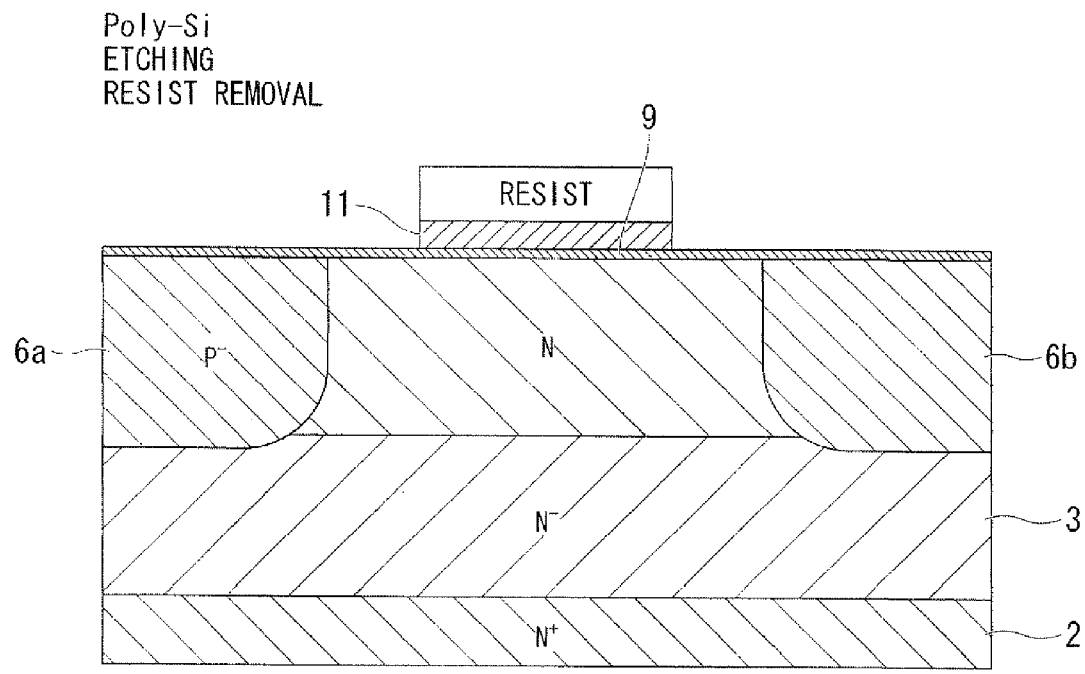
FIG. 4A is a cross-sectional view showing a method of manufacturing the semiconductor device.

The etching of the polysilicon layer is carried out by anisotropic etching, isotropic etching, or the like with the resist pattern serving as a mask. As a result, the gate oxide film 9 in a given shape and the polysilicon layer 11 as the gate electrode are formed at given positions (FIG. 4A). Then, the used resist is removed.

Figure 4B:
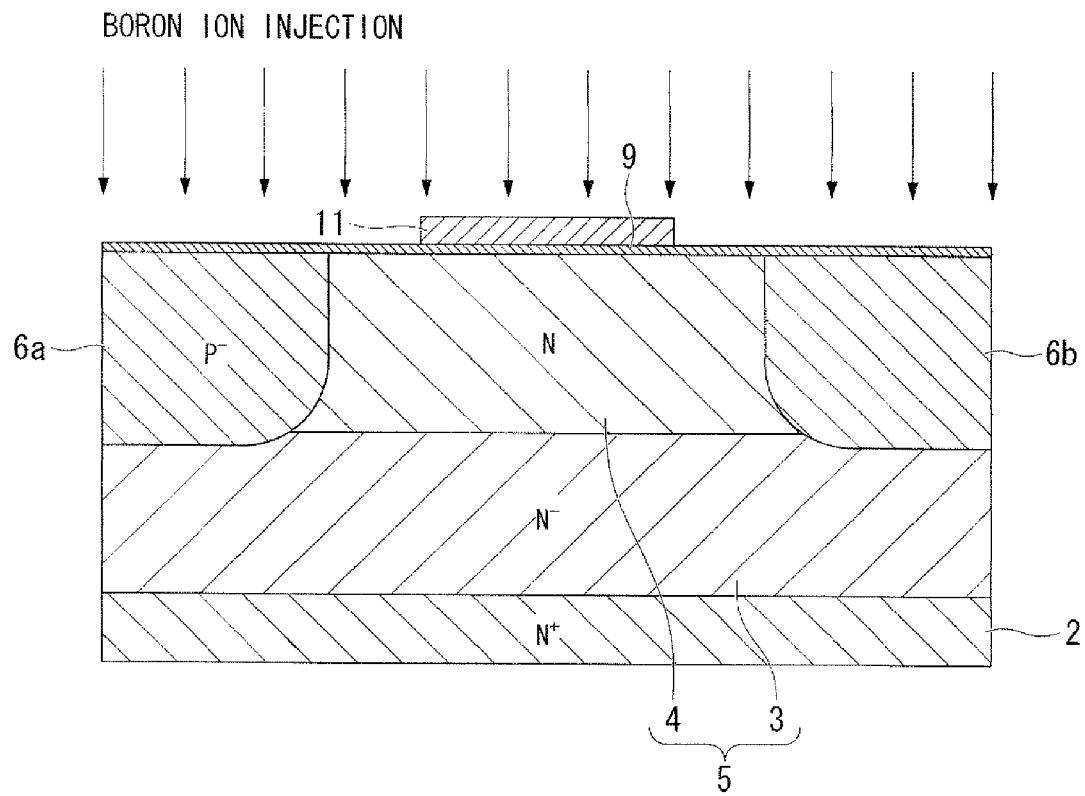
FIG. 4B is a cross-sectional view showing a method of manufacturing the semiconductor device.

Boron for forming a diffusion layer of the base region 7a (7b) is ion-injected at the energy of 80 keV according to $4\times10^{13}$ to $5\times10^{13}$ cm$^{-2}$ (FIG. 4B).

Figure 5A:
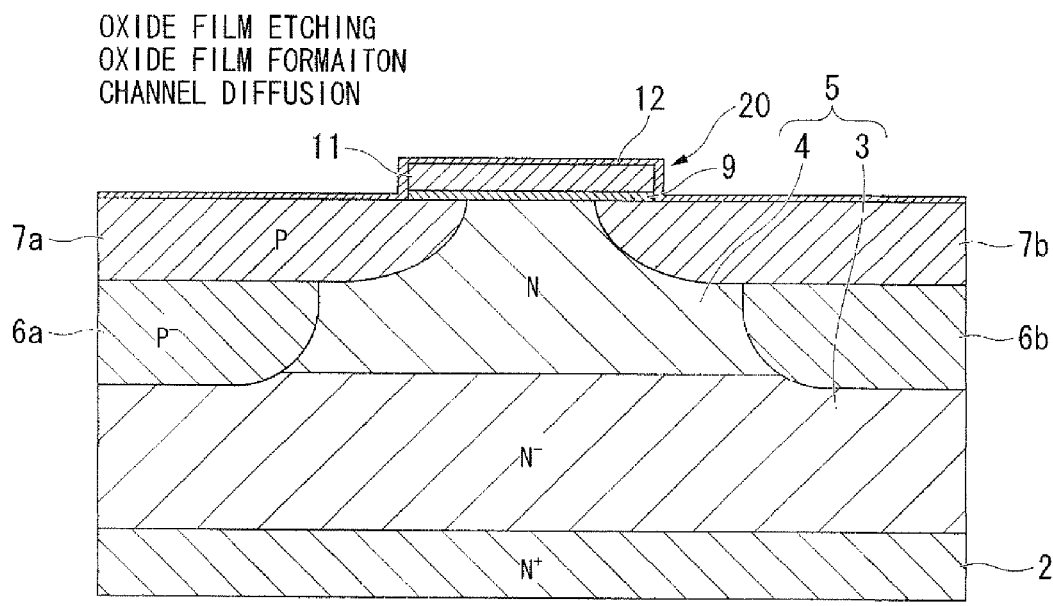
FIG. 5A is a cross-sectional view showing a method of manufacturing the semiconductor device.
Figure 5B:
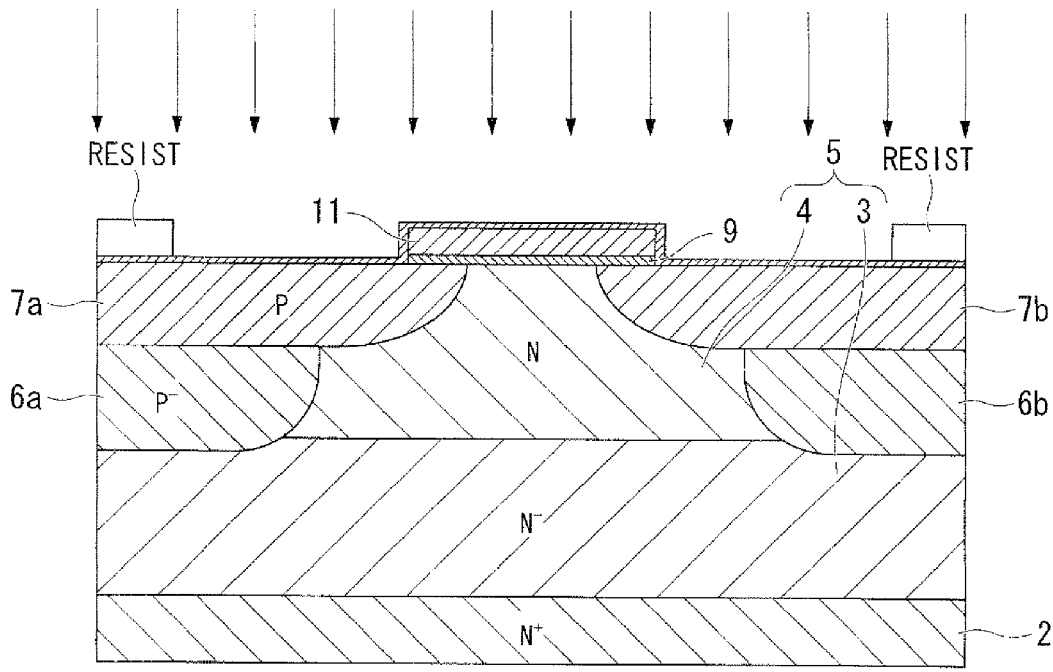
FIG. 5B is a cross-sectional view showing a method of manufacturing the semiconductor device.

The gate oxide film 9 on which the gate pattern of the polysilicon layer 11 is not formed, in other words, the exposed gate oxide film 9 is removed. A new oxide film 12 is formed on the exposed silicon surface, diffusion processing (channel diffusion) is carried out, and a diffusion layer for the base region 7a (7b) is formed (FIG. 5A). As a result, the gate oxide film 9, the polysilicon layer 11, and the oxide film 12 form the gate 20.

A resist is applied to form the base region 8a (8b), a photolithography is carried out with a mask for forming a source region, and a resist pattern is formed. Then, arsenic for forming a diffusion layer of the source region 8a (8b) is ion-injected at the energy of 100 keV according to $5\times10^{16}$ to $10\times10^{16}$ cm$^{-2}$ with the gate 20 and the formed resist pattern serving as masks (FIG. 5B), and then the resist pattern used as the mask is removed.

Figure 6A:
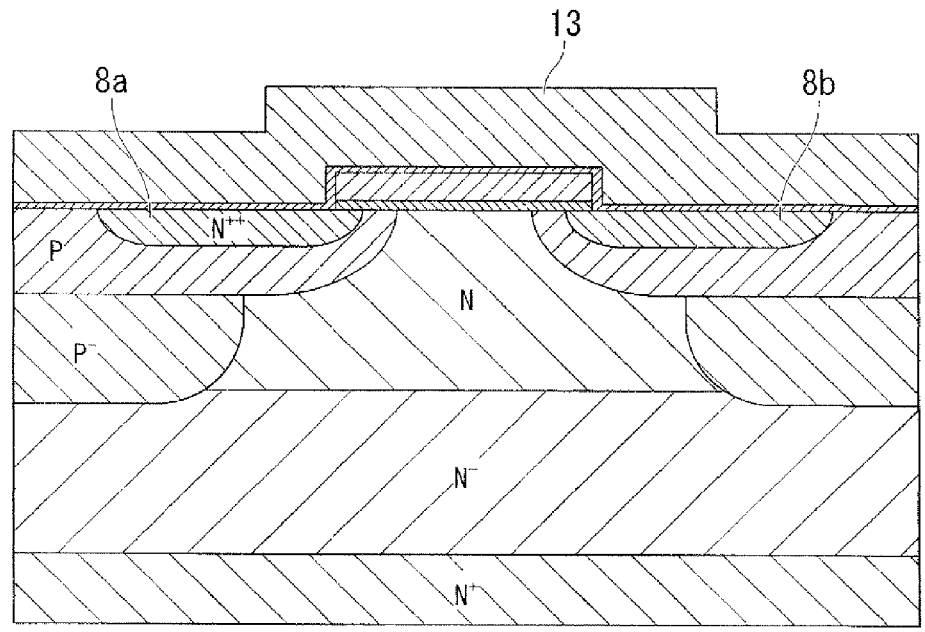
FIG. 6A is a cross-sectional view showing a method of manufacturing the semiconductor device.

By CVD (Chemical Vapor Deposition), PSG (Phosphorus Silicon Glass) 13 is layered on the entire surface of the semiconductor substrate as an interlayer insulating film (FIG. 6A).

After the PSG 13 is layered on the entire surface of the semiconductor substrate as the interlayer insulating film by the CVD, diffusion processing for forming a diffusion layer of the source region 8a (8b) and reflow processing for the PSG 13 (processing for planarizing the film surface) are carried out at the same time using thermal treatment.

To form a contact for the base region 7a (7b) and the source region 8a (8b), a resist is applied to the entire semiconductor substrate, a photolithography is carried out using a mask for forming the contact, and a resist pattern of the contact is formed.

Figure 6B:
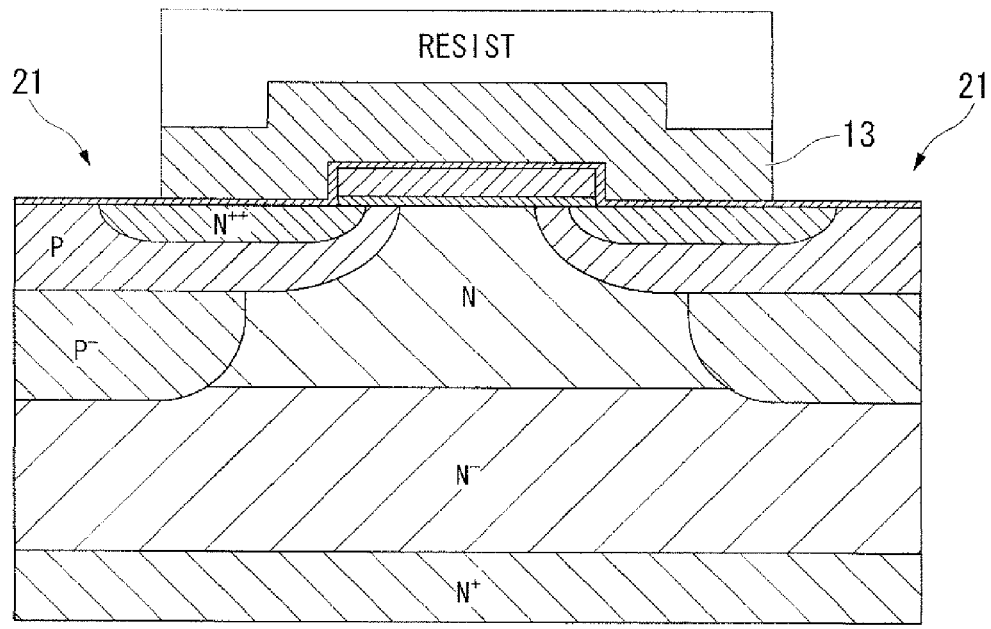
FIG. 6B is a cross-sectional view showing a method of manufacturing the semiconductor device.

The PSG 13 formed on the entire surface and the oxide film 12 are etched using the resist pattern of the contact, contact holes 21 where a part of the base region 7a (7b) and the source region 8a (8b) are exposed are formed with respect to the PSG 13 and the oxide film 12, and then the resist is removed (FIG. 6B).

Aluminum is deposited on the surface of the semiconductor substrate on which the PSG 13 is formed using a sputtering method (or a vapor-deposition method) to form the source electrode 14 (surface electrode). The source electrode 14 is electrically connected to the source region 8a (8b) and the base region 7a (7b) through the aluminum deposited in the contact holes 21 and insulated from the polysilicon layer 11 of the gate 20 through the PSG 13 of the interlayer insulating layer. The gate 20 is electrically connected to the outside through a non-depicted conductive material buried in the contact holes and processed not to be short-circuited with the source electrode 14.

Figure 6C:
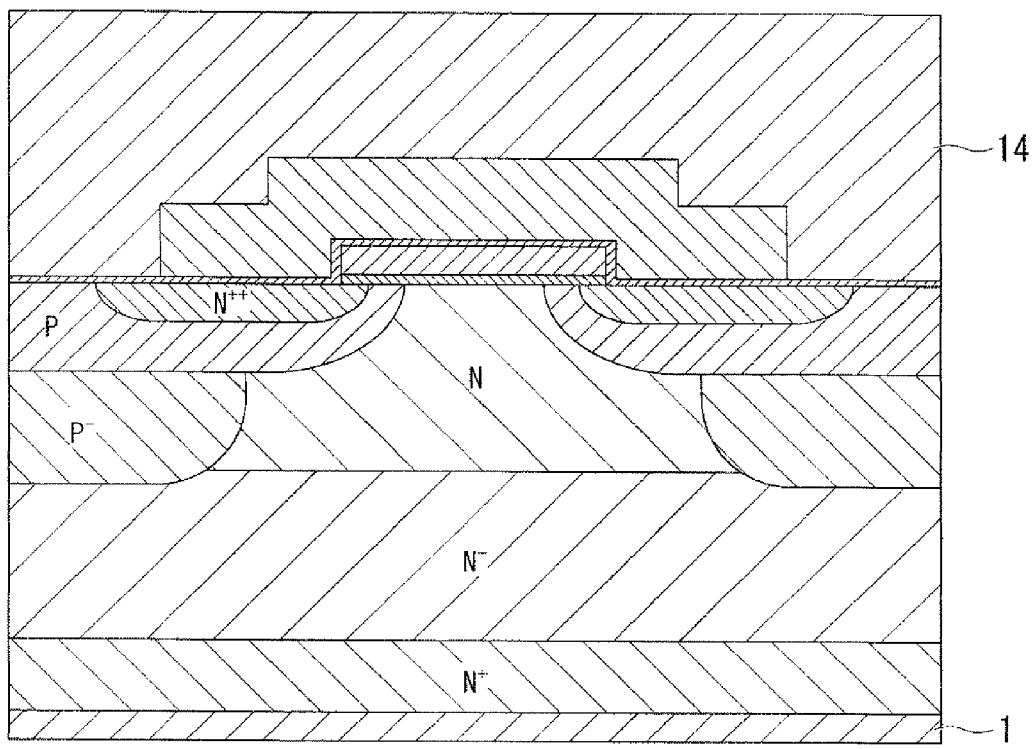
FIG. 6C is a cross-sectional view showing a method of manufacturing the semiconductor device.

A multi-layer metal film of Ti—Ni—Ag is deposited on the back surface of the semiconductor substrate where the gate 20 is not formed using the sputtering method (or a vapor-deposition method), and the drain electrode 1 (rear electrode) electrically connected to the drain layer 2 is formed (FIG. 6C).

After the above process, the semiconductor device 10 shown in FIG. 1 is formed.

Hereinafter, a simulation result concerning the withstand voltage difference between the semiconductor device 10 of the present embodiment and the semiconductor device having the conventional structure (two-dimensional device simulator MEDICI (registered trademark), TMA (Technology Modeling Associates)) is explained below with reference to FIGS. 8 to 25.

Figure 8:
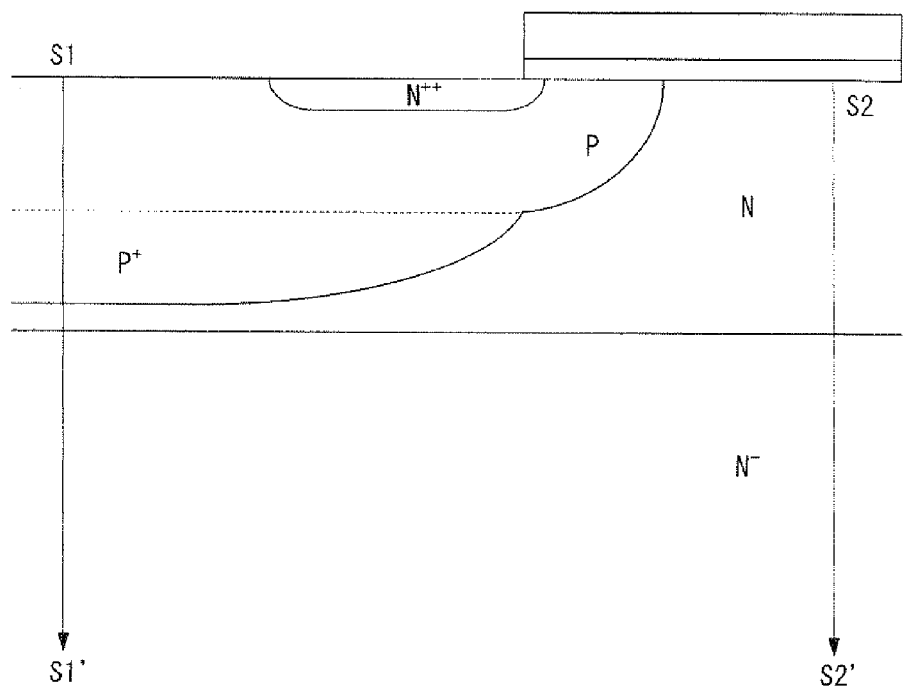
FIG. 8 is a cross-sectional view showing a structure of the conventional semiconductor device.
Figure 9:
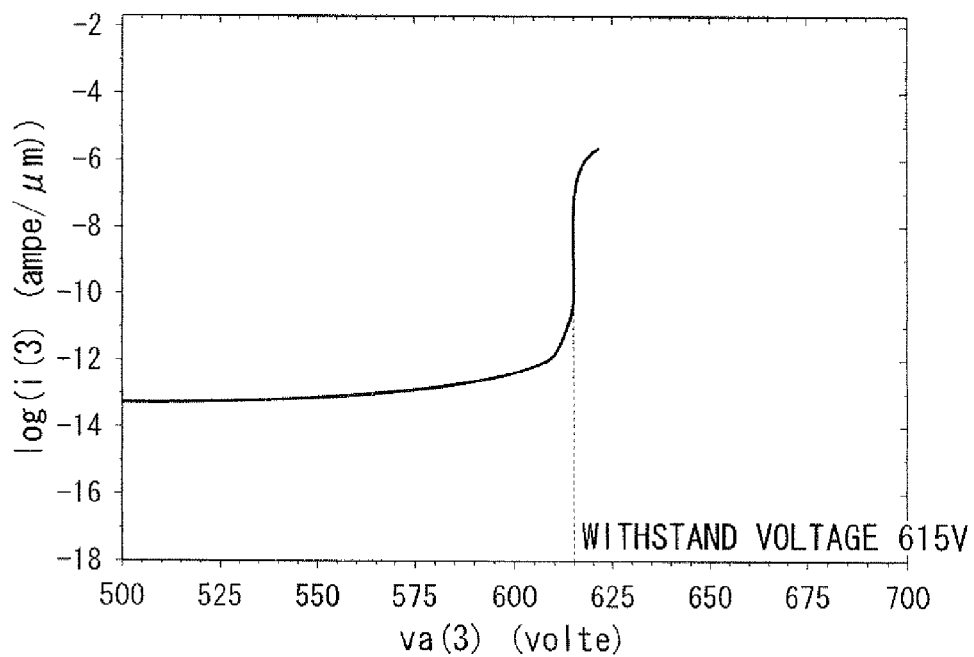
FIG. 9 is a graph showing a withstand voltage of a MOSFET having a conventional structure in a simulation.
Figure 10:
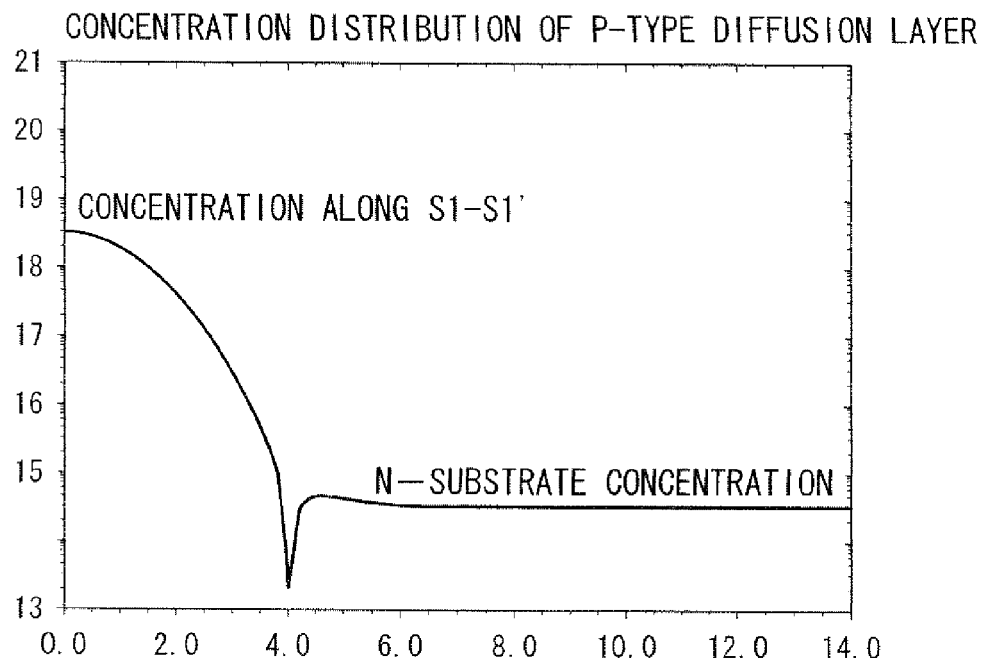
FIG. 10 is a graph showing impurity concentration in the depth direction at a cross section along a line S1-S1' shown in FIG. 8.
Figure 11:
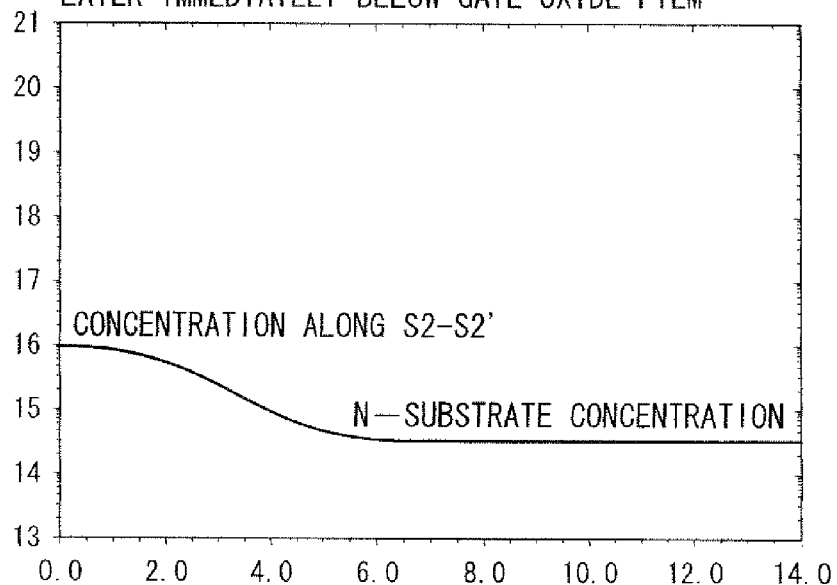
FIG. 11 is a graph showing impurity concentration in the depth direction along a line S2-S2' of a cross section shown in FIG. 8.

FIG. 8 schematically shows a cross sectional structure of the conventional semiconductor device having a general two-base structure. As shown in FIG. 9 showing the simulation result, the withstand voltage was 615 V. FIG. 9 shows a voltage as the withstand voltage result of the MOSFET having the conventional structure where the horizontal axis represents a voltage and the vertical axis represents a current value. An impurity concentration distribution of a P layer (first base region), a P+ layer (second base region), the reference concentration layer 4, and the low concentration layer 3 shown in FIG. 8 along S1-S1' is shown in FIG. 10, and the impurity concentration distribution along S2-S2' immediately under the gate is shown in FIG. 11. As shown in FIGS. 10 and 11, the horizontal axis represents the distance from the surface of the semiconductor device in the depth direction, and the vertical axis represents impurity concentration.

Figure 12:
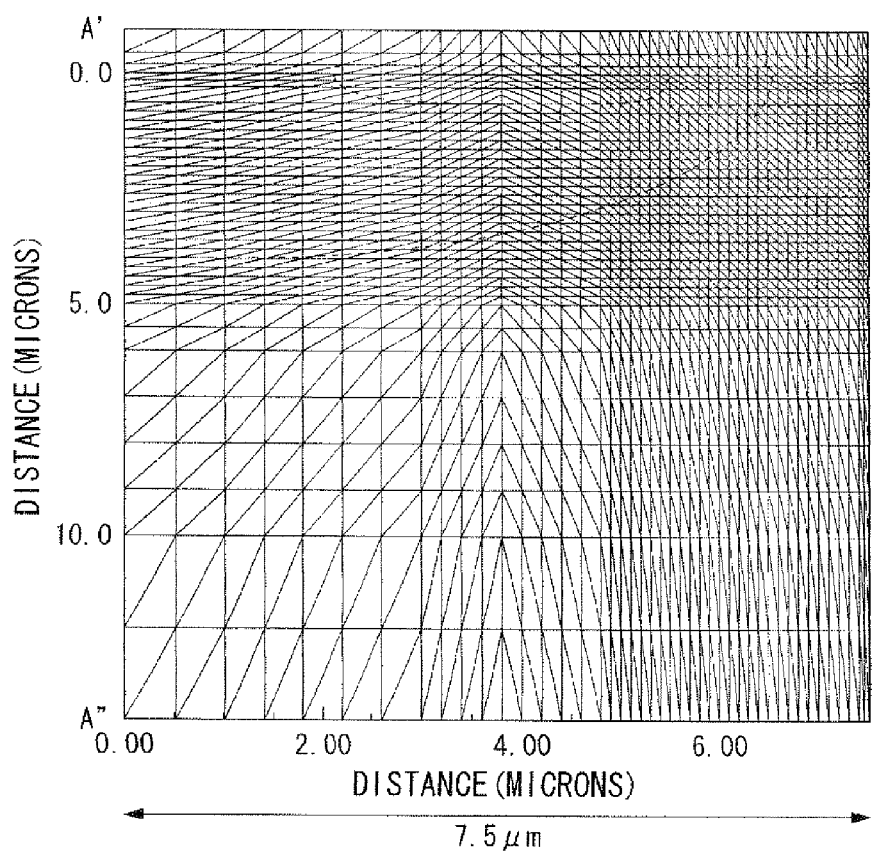
FIG. 12 is a graph showing the structure shown in FIG. 8 and modeled for a simulation.

While a reverse bias is applied to the MOSFET having the structure shown in FIG. 8 and the voltage is increased gradually, a portion of low withstand voltage is verified. FIG. 12 schematically shows the cross section of the semiconductor device shown in FIG. 8 that is modeled for a simulation where the horizontal axis represents the distance from the surface of the semiconductor device in the depth direction (A'-A") and the horizontal axis represents the position of an axis parallel to the surface of the semiconductor device.

In addition, FIG. 8 shows a simulation model corresponding to the left side of the intermediate position B shown in FIG. 1. However, the simulation is carried out for a symmetric structure folded back at the intermediate position in reality.

FIGS. 13A and 13B to 16A and 16B are graphs showing extension states and field strength of the depletion layer when a reverse bias voltage (VDSS) is applied to the MOSFET having the conventional structure shown in FIG. 8. FIGS. 13A to 16A are graphs showing the extension and field of the depletion layer where the horizontal axis represents the distance in the depth direction from the surface and the vertical axis represents the position of an axis parallel to the surface. As for FIGS. 13B to 16B, the vertical axis represents the field strength, the horizontal axis represents the distance in the depth direction corresponding to the vertical axis of each FIG. 13A to 16A, and a reference numeral appended to each line of the graph represents the position corresponding to the distance corresponding to the horizontal axis of FIG. 12. As for the depth direction, although the depth of the substrate set as the simulation is 40 μm, only the results for a depth less than 14 μm are shown in FIGS. 13B to 16B (the same applies to FIGS. 22B to 25B explained hereinafter). For this reason, the end of the depletion layer at a depth more than 14 μm is not shown and omitted in FIGS. 13A to 16A.

Figure 13A:
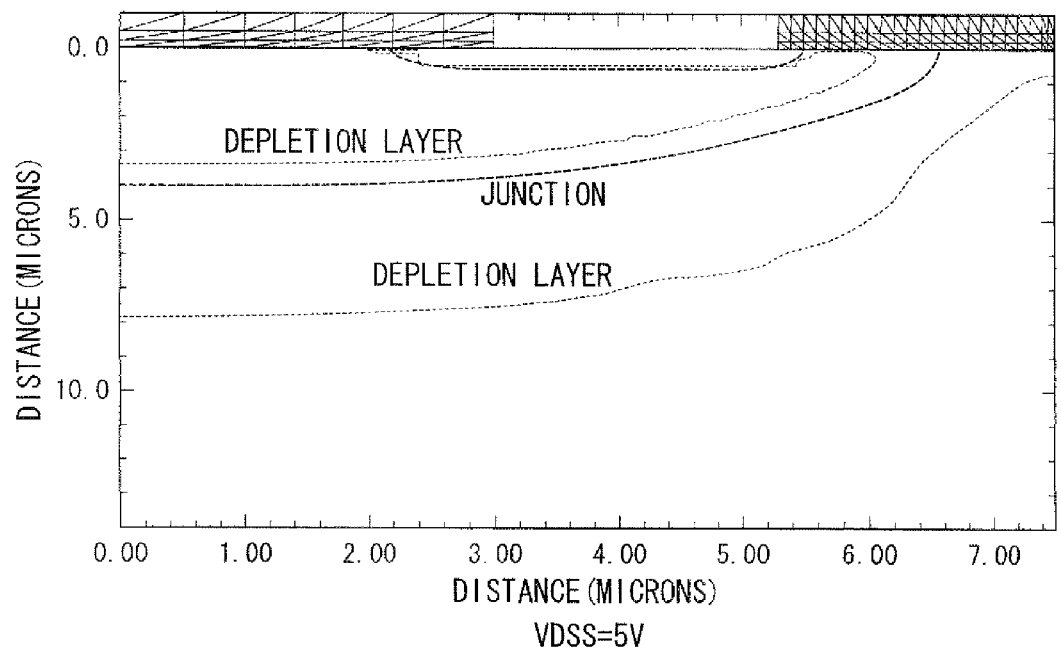
FIG. 13A is a graph showing field strength at an output point shown in FIG. 12 when a reverse bias (5 V) is applied.
Figure 13B:
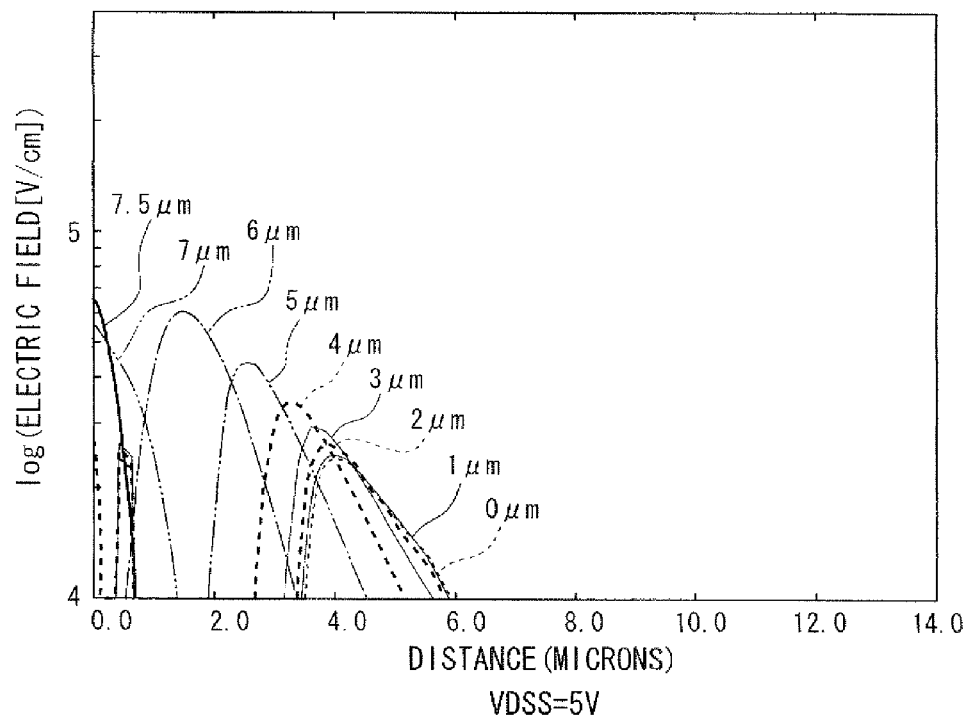
FIG. 13B is a graph showing field strength at an output point shown in FIG. 12 when the reverse bias (5 V) is applied.

FIGS. 13A and 13B are graphs showing an extension state and field strength of the depletion layer when a reverse bias of VDSS=5 is applied. The depletion layer starts extending as shown in FIG. 13A, but the field strength is not high which can be understood from FIG. 13B.

Figure 14A:
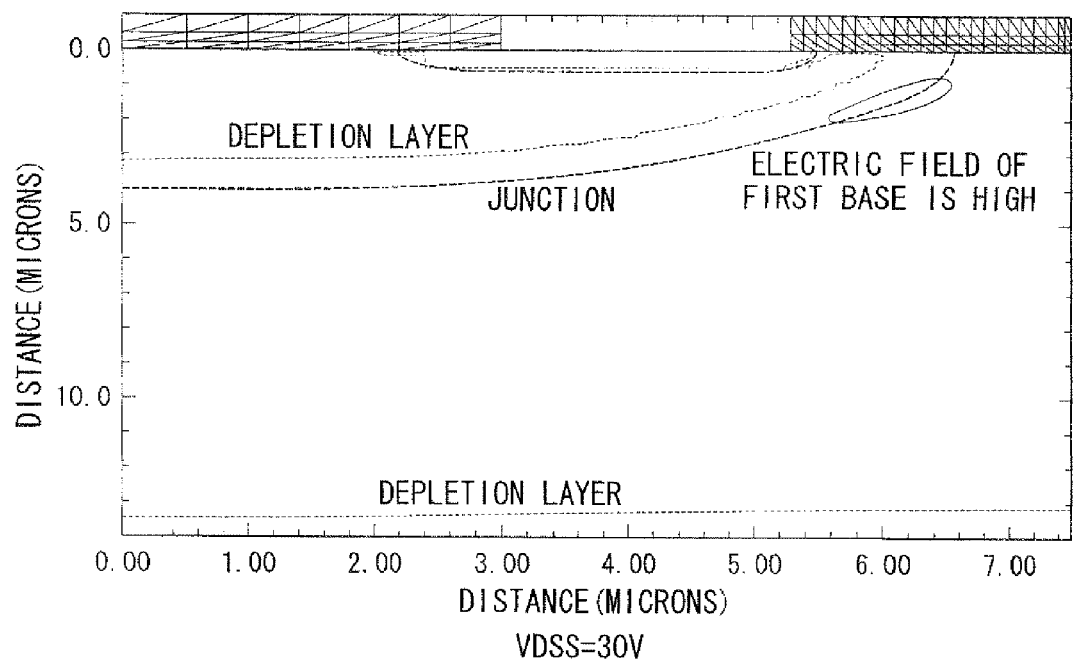
FIG. 14A is a graph showing field strength at an output point shown in FIG. 12 when a reverse bias (30 V) is applied.
Figure 14B:
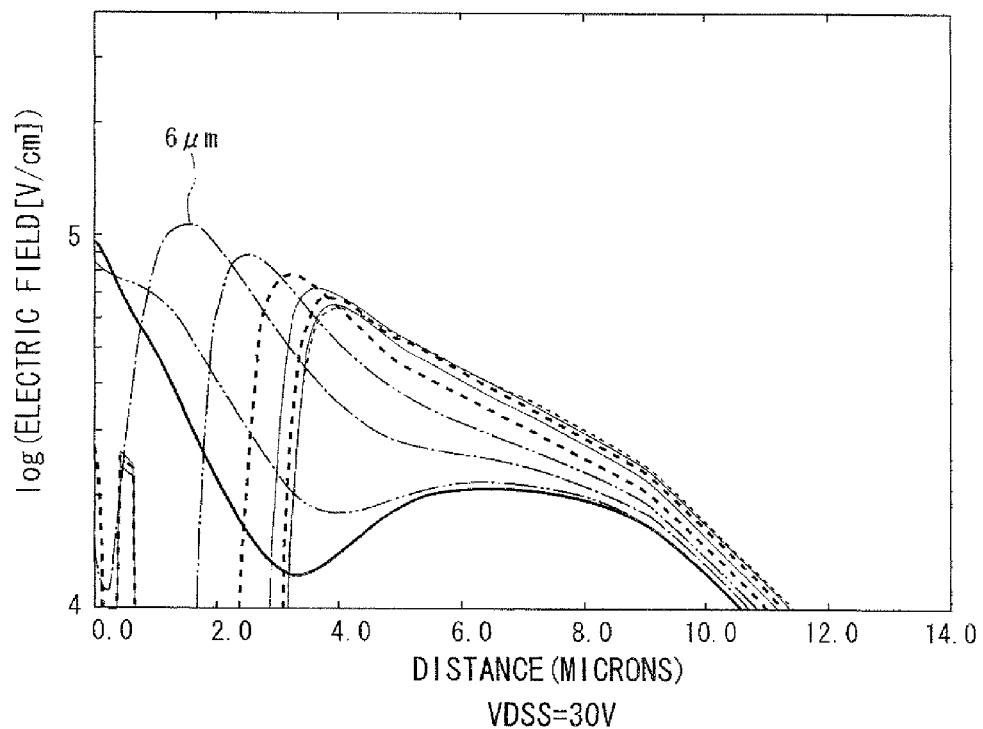
FIG. 14B is a graph showing field strength at an output point shown in FIG. 12 when the reverse bias (30 V) is applied.

FIGS. 14A and 14B are graphs showing an extension state and field strength of the depletion layer when a reverse bias of 30 V is applied. As shown in FIGS. 14A and 14B, it is understood that the field strength of the edge portion of the curved portion of the diffusion layer of the P layer (first base region) is high compared with other portions.

Figure 15A:
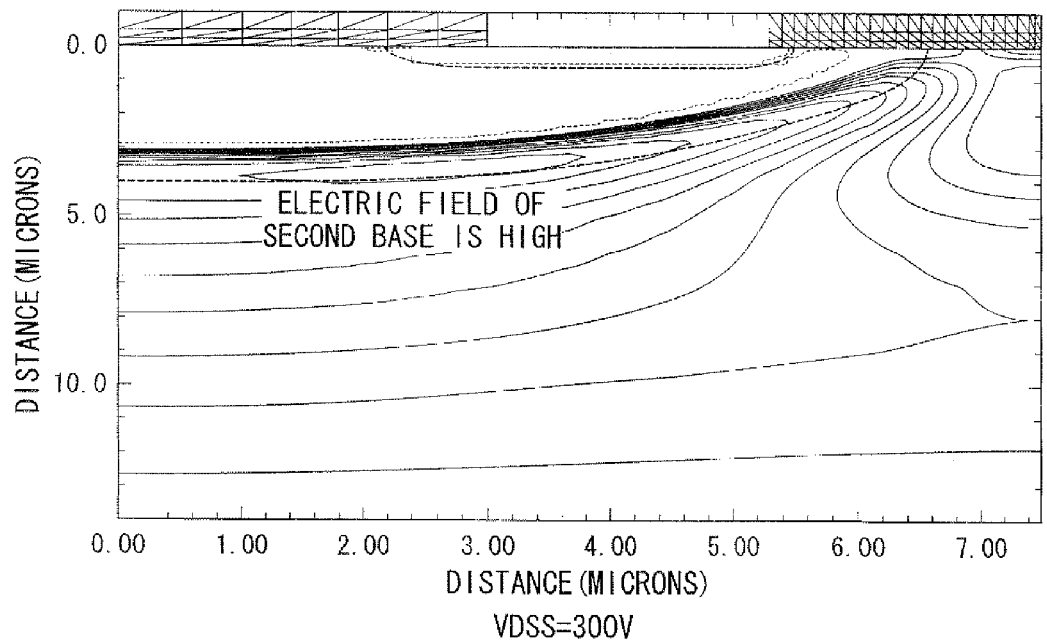
FIG. 15A is a graph showing field strength at an output point shown in FIG. 12 when a reverse bias (300 V) is applied.
Figure 15B:
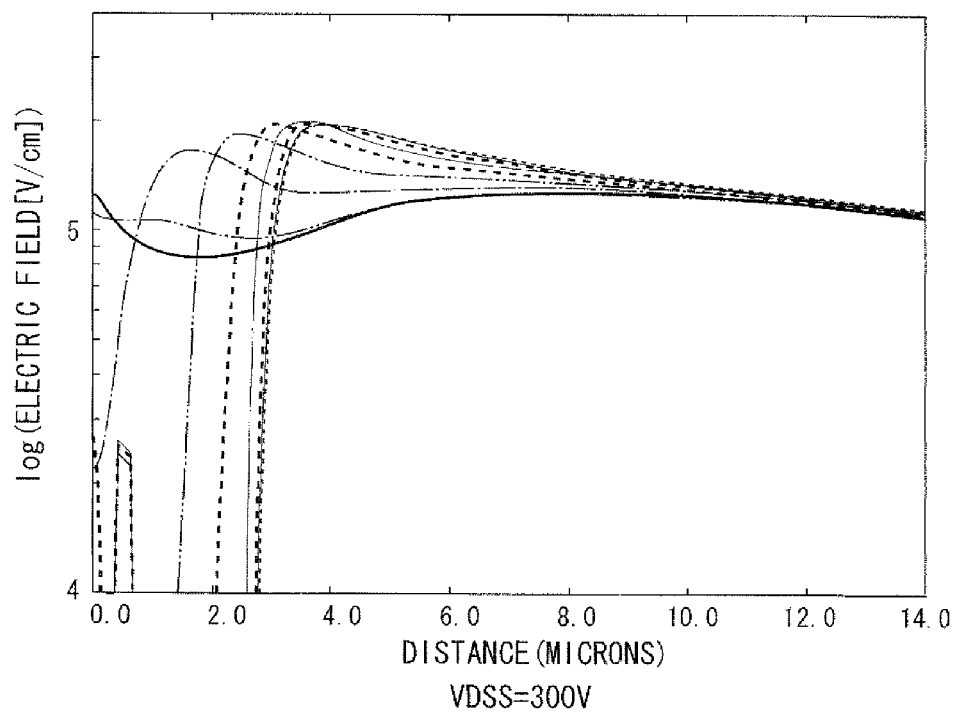
FIG. 15B is a graph showing field strength at an output point shown in FIG. 12 when the reverse bias (300 V) is applied.

FIGS. 15A and 15B are graphs showing an extension state and field strength of the depletion layer when a reverse bias of VDSS=300 V is applied. As shown in FIG. 5A, it is understood from FIG. 15B that the field strength at the lower portion of the diffusion layer of the P+ layer (second base region) is high compared with other portions including the edge portion. At the edge portion of the P layer, it is considered that the depletion layer from the P layer (first base region) and the depletion layer from the opposing P layer (first base region) connect to each other, and thereby an increase in the field strength is prevented.

Figure 16A:
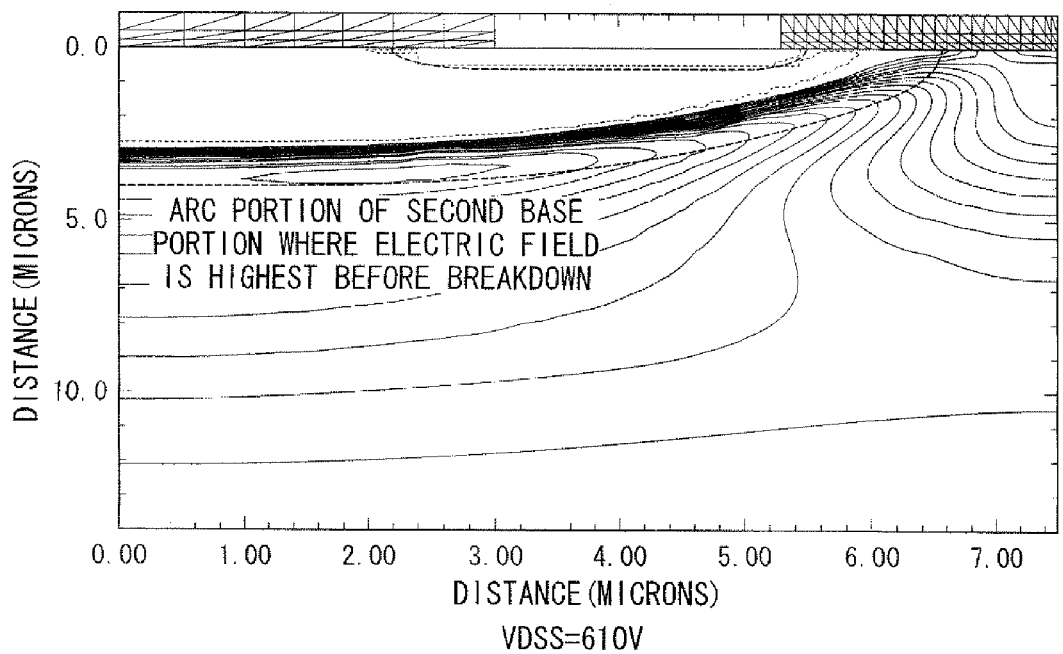
FIG. 16A is a graph showing field strength at an output point shown in FIG. 12 when a reverse bias (610 V) is applied.
Figure 16B:
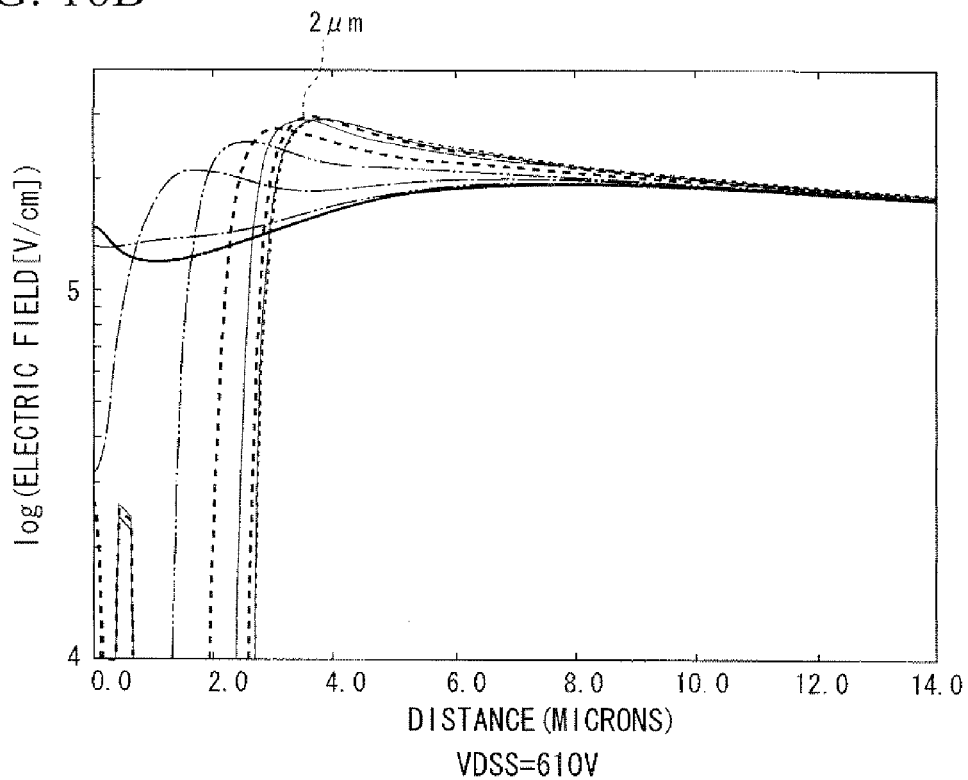
FIG. 16B is a graph showing field strength at an output point shown in FIG. 12 when the reverse bias (610 V) is applied.

FIGS. 16A and 16B are graphs showing an extension state and field strength of the depletion layer when a reverse bias of VDSS=610 V close to the withstand voltage is applied. As shown in FIG. 16A, it is understood from FIG. 16B that the field strength at the lower portion of the diffusion layer of the P+ layer (second base region) is high compared with the other portions as continued from the state of FIG. 15.

It is understood from the simulation of the conventional structure that the withstand voltage is determined by the increase in the field strength at the bottom portion of the P+ layer (second base region).

Based on the simulation result, to prevent an increase in the field strength at the bottom surface of the diffusion layer of the P layer (base regions 7a and 7b) in the present embodiment, as shown in FIG. 1, the bottom surface of the P− layer (depletion-layer extension region 6) is set deeper than the N− layer (low concentration layer 3), and the thickness of the P− layer (depletion-layer extension region 6a and 6b) is set twice that of the P layer (base regions 7a and 7b). Thereby, the depletion layer extends easily, and the increase in the field strength becomes substantially equal to that at other portions.

Hereinafter, a simulation result of the present embodiment is explained with reference to FIGS. 17 to 25.

Figure 17:
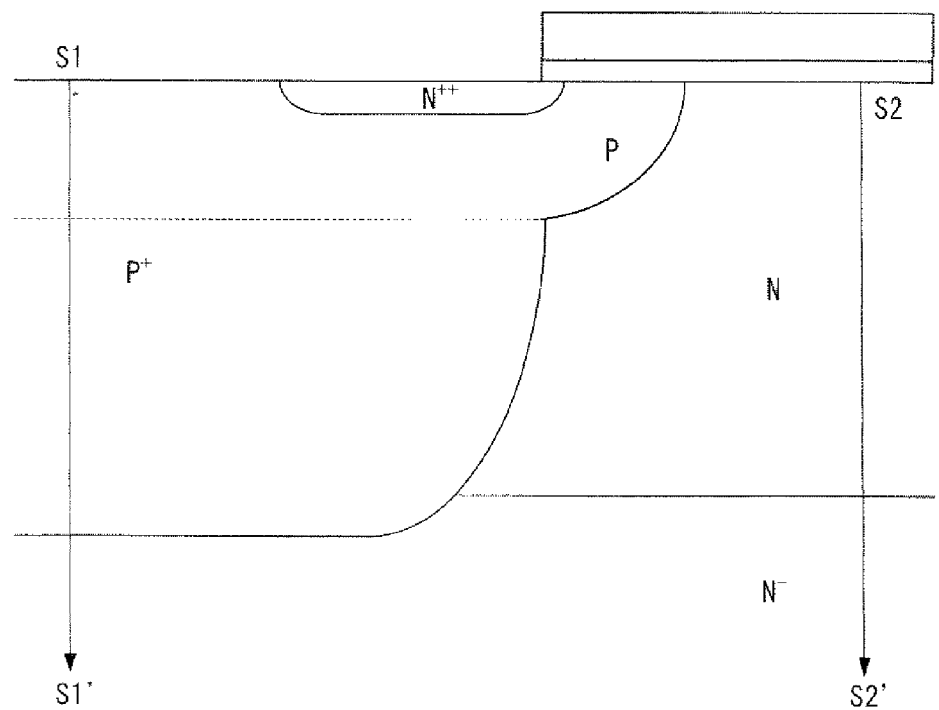
FIG. 17 is a cross sectional view showing a structure of the semiconductor device according to the present embodiment used in the simulation.
Figure 18:
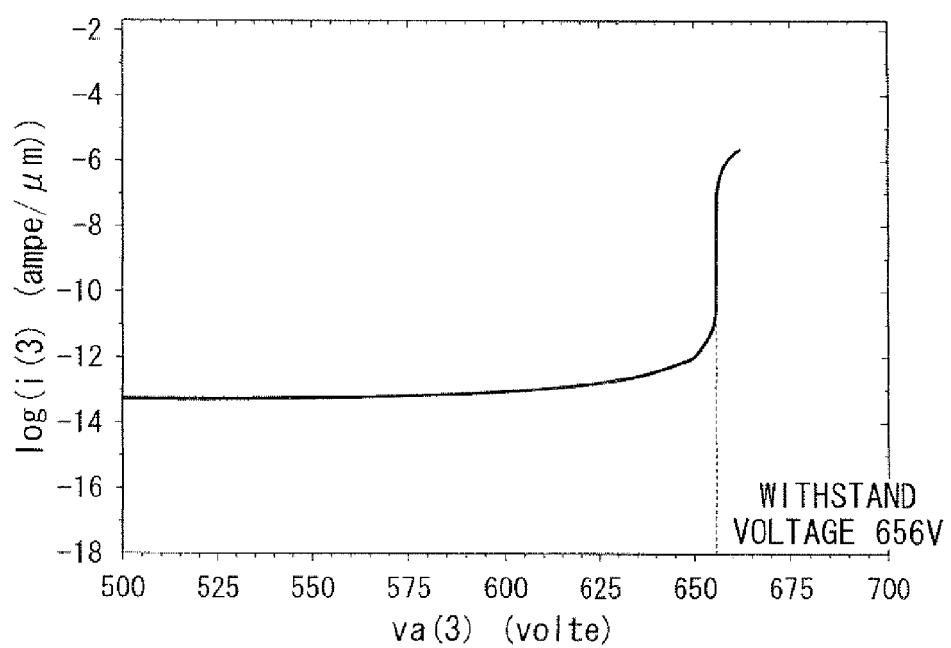
FIG. 18 is a graph showing withstand voltage of MOSFET according to the present embodiment in the simulation.

FIG. 17 schematically shows a cross section of the semiconductor device (shown in FIG. 1) of the present embodiment. As shown in FIG. 18 as the simulation result, the withstand voltage was 656 V. FIG. 18 shows a voltage of the withstand voltage result of the MOSFET having the structure of the present embodiment where the horizontal axis represents a voltage and the vertical axis represents a current value.

Figure 19:
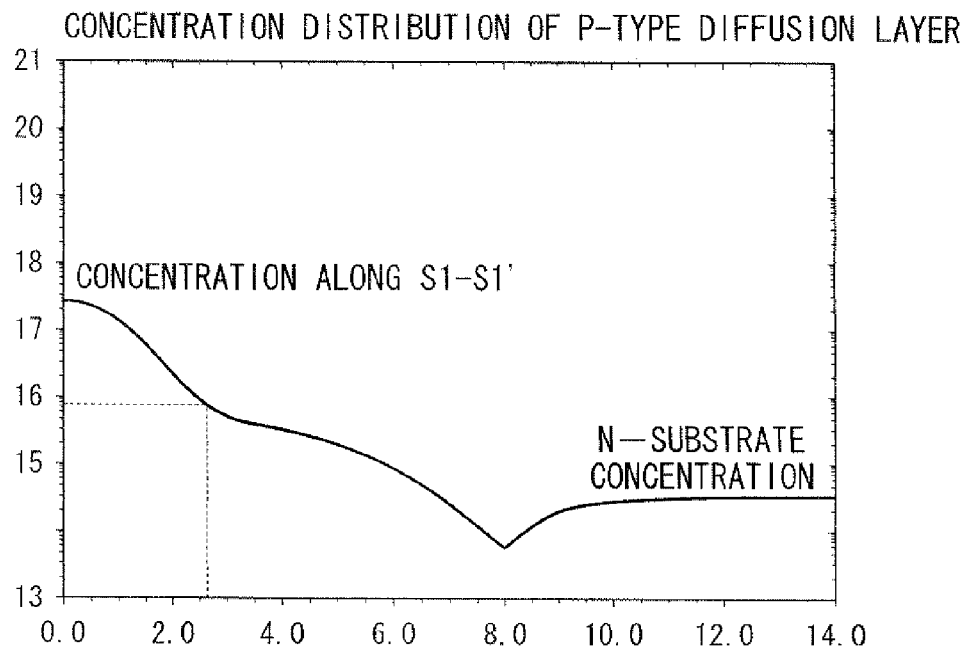
FIG. 19 is a graph showing impurity concentration in the depth direction along a line S1-S1' of a cross section shown in FIG. 17.
Figure 20:
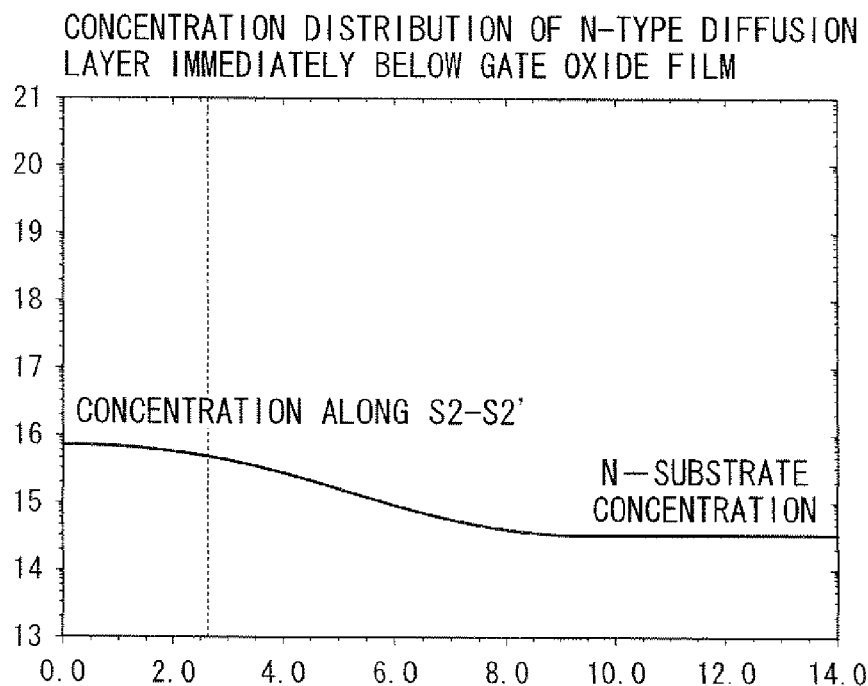
FIG. 20 is a graph showing impurity concentration in the depth direction along a line S2-S2' of a cross section shown in FIG. 17.

An impurity concentration distribution of a P layer (base regions 7a and 7b), a P− layer (depletion-layer extension regions 6a and 6b), the reference concentration layer 4, and the low concentration layer 3 along S1-S1' of FIG. 17 is shown in FIG. 19. An impurity concentration distribution along S2-S2' immediately under the gate is shown in FIG. 20. As shown in FIGS. 19 and 20, the horizontal axis represents the distance from the surface of the semiconductor device in the depth direction and the vertical axis represents impurity concentration.

Figure 21:
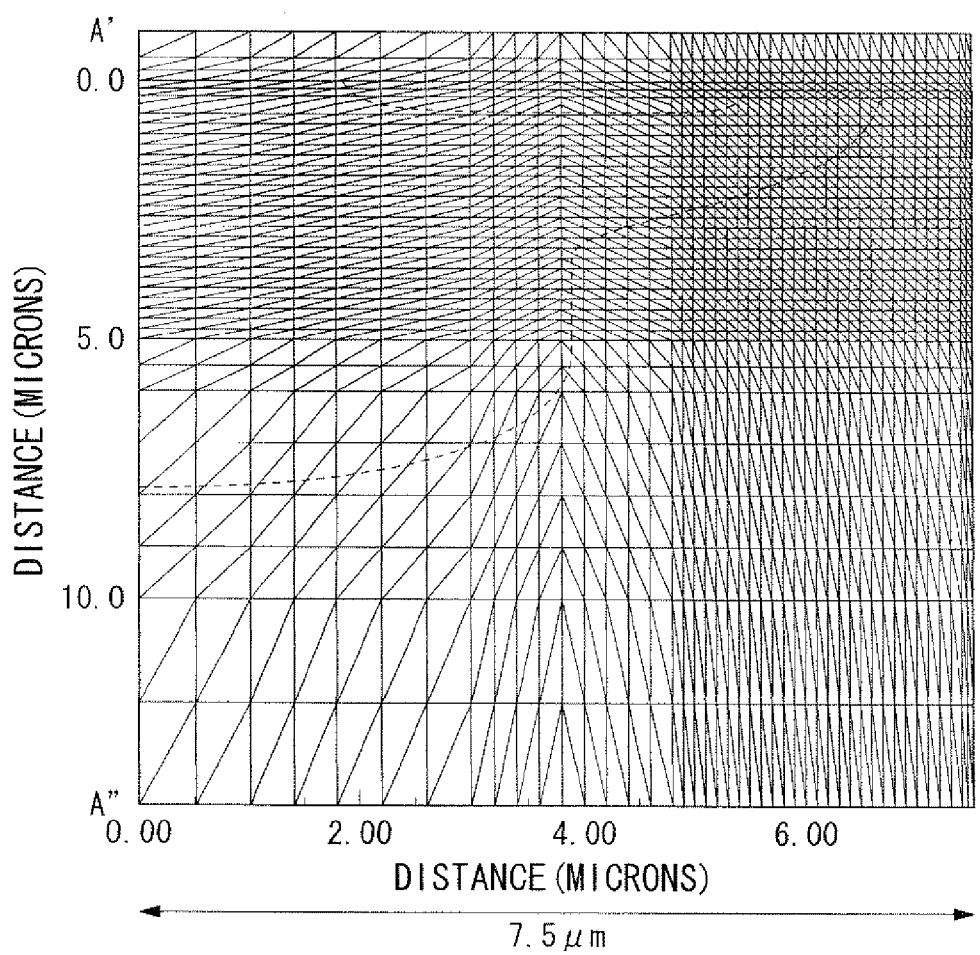
FIG. 21 is a graph showing the structure shown in FIG. 17 and modeled for a simulation.

While a reverse bias is applied to the MOSFET having the structure shown in FIG. 17 and the voltage is increased gradually, a portion of low withstand voltage is verified. FIG. 21 schematically shows the cross section of the semiconductor device shown in FIG. 17 that is modeled for the simulation where the horizontal axis represents the distance from the surface of the semiconductor device in the depth direction (A'-A") and the horizontal axis represents the position of an axis parallel to the surface of the semiconductor device.

In addition, FIG. 17 shows the simulation model corresponding to the left side of the intermediate position B shown in FIG. 1. In fact, however, the simulation is carried out for a symmetric structure folded back at the intermediate position.

FIGS. 22A and 22B to 25A and 25B are graphs showing extension states and field strength of the depletion layer when a reverse bias voltage is applied to the MOSFET having the conventional structure shown in FIG. 8. FIGS. 22A to 25A are graphs showing the extension and field strength of the depletion layer where the horizontal axis represents the distance in the depth direction from the surface and the vertical axis represents the position of an axis parallel to the surface. As for FIGS. 22B to 25B, the vertical axis represents the field strength, the horizontal axis represents the distance in the depth direction corresponding to the vertical axis of each FIG. 22A to 25A, and a reference numeral appended to each line of the graph represents the position corresponding to the distance shown by the horizontal axis of FIG. 21.

Figure 22A:
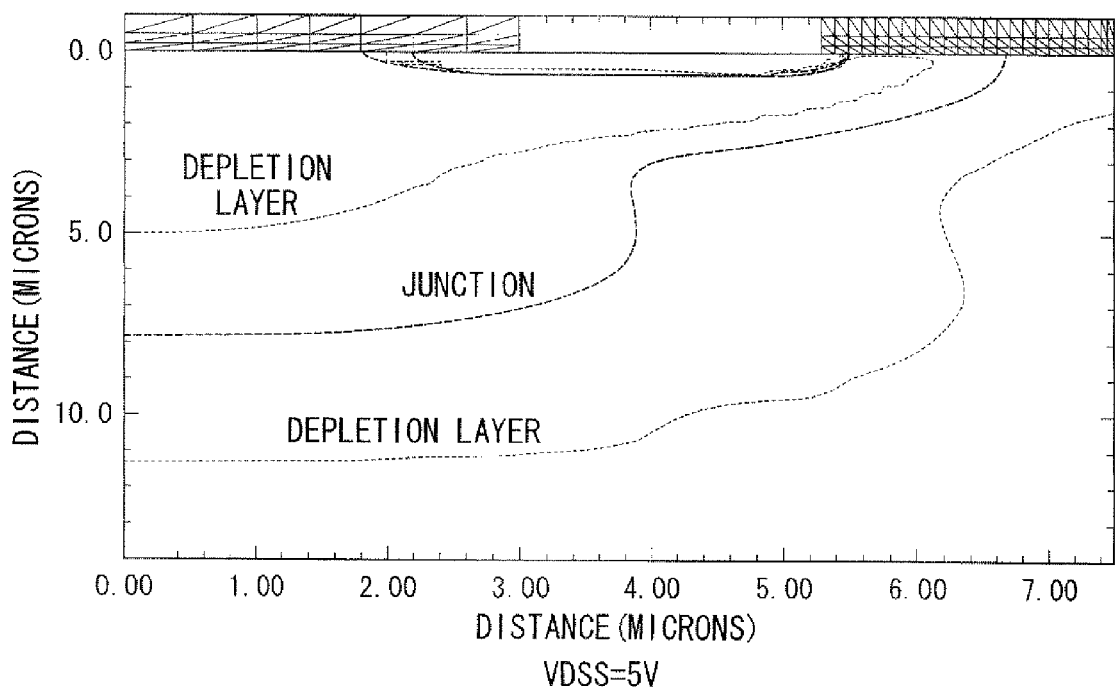
FIG. 22A is a graph showing field strength at an output point shown in FIG. 21 when a reverse bias (5 V) is applied.
Figure 22B:
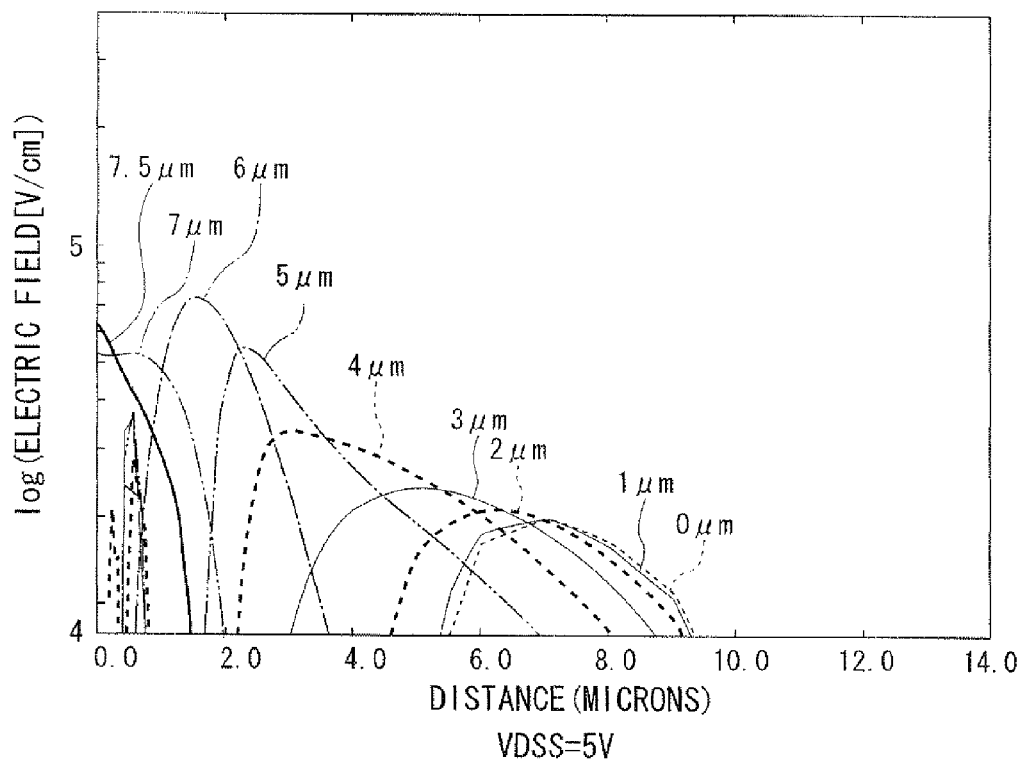
FIG. 22B is a graph showing field strength at an output point shown in FIG. 21 when the reverse bias (5 V) is applied.

FIGS. 22A and 22B are graphs showing an extension state and field strength of the depletion layer when a reverse bias of VDSS=5 V is applied. The depletion layer starts extending as shown in FIG. 22A, but the field strength is not so high as can be understood from FIG. 22B. At the P– layer (depletion-layer extension regions 6a and 6b) in the structure of the present embodiment, the depletion layer extends compared with the conventional state shown in FIG. 13A, and the field strength is lower compared with that shown in FIG. 13B.

Figure 23A:
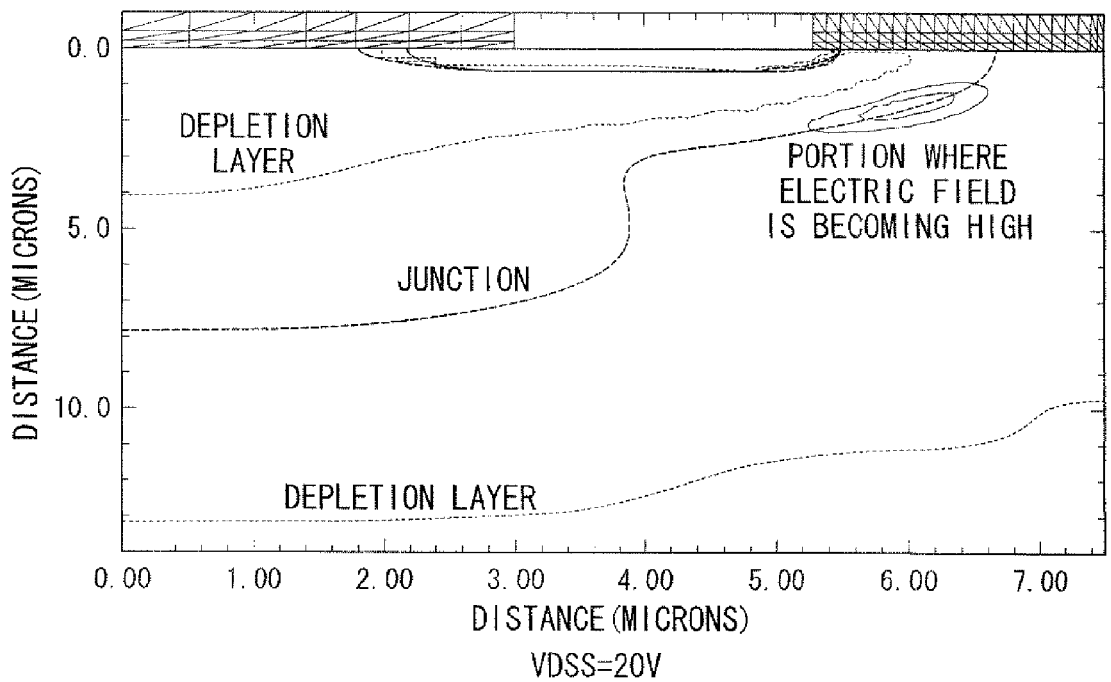
FIG. 23A is a graph showing field strength at an output point shown in FIG. 21 when a reverse bias (5 V) is applied.
Figure 23B:
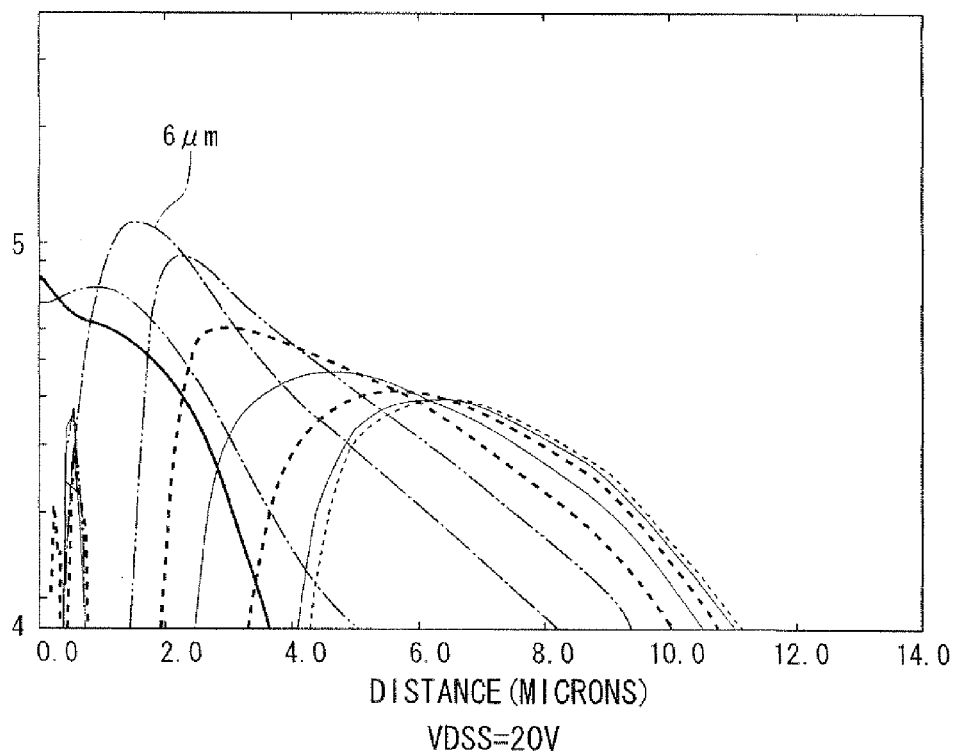
FIG. 23B is a graph showing field strength at an output point shown in FIG. 21 when the reverse bias (5 V) is applied.

FIGS. 23A and 23B are graphs showing an extension state and field strength of the depletion layer when a reverse bias of 20 V is applied. As shown in FIGS. 23A and 23B, it is understood that the field strength at the edge of the curved portion of the diffusion layer of the P layer (base regions 7a and 7b) is high compared with the other portions.

Figure 24A:
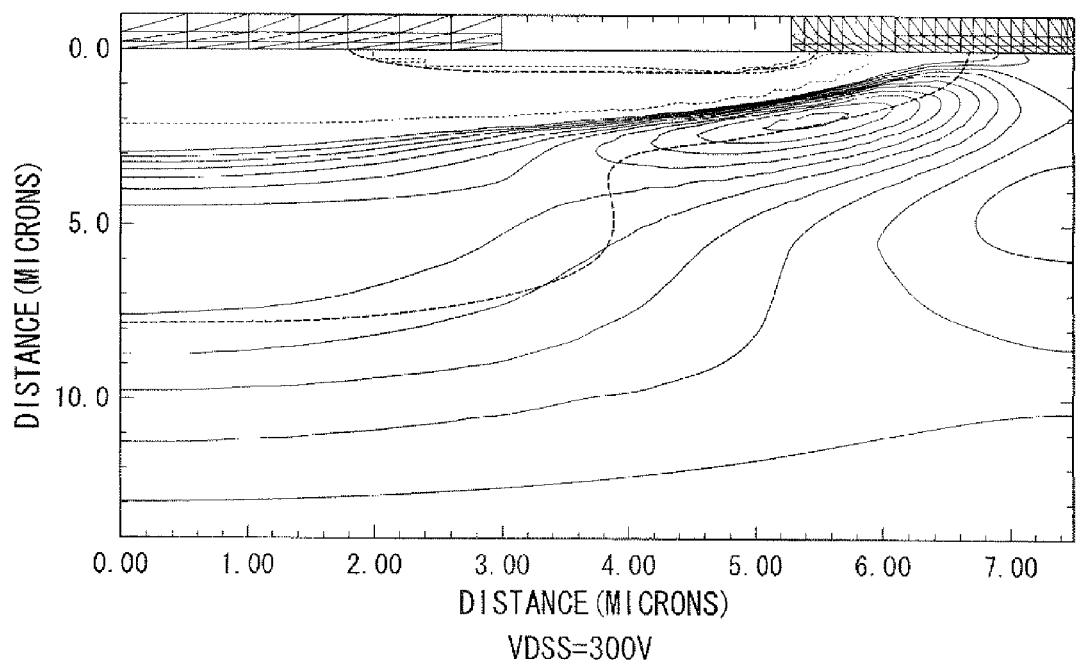
FIG. 24A is a graph showing field strength at an output point shown in FIG. 21 when a reverse bias (300 V) is applied.
Figure 24B:
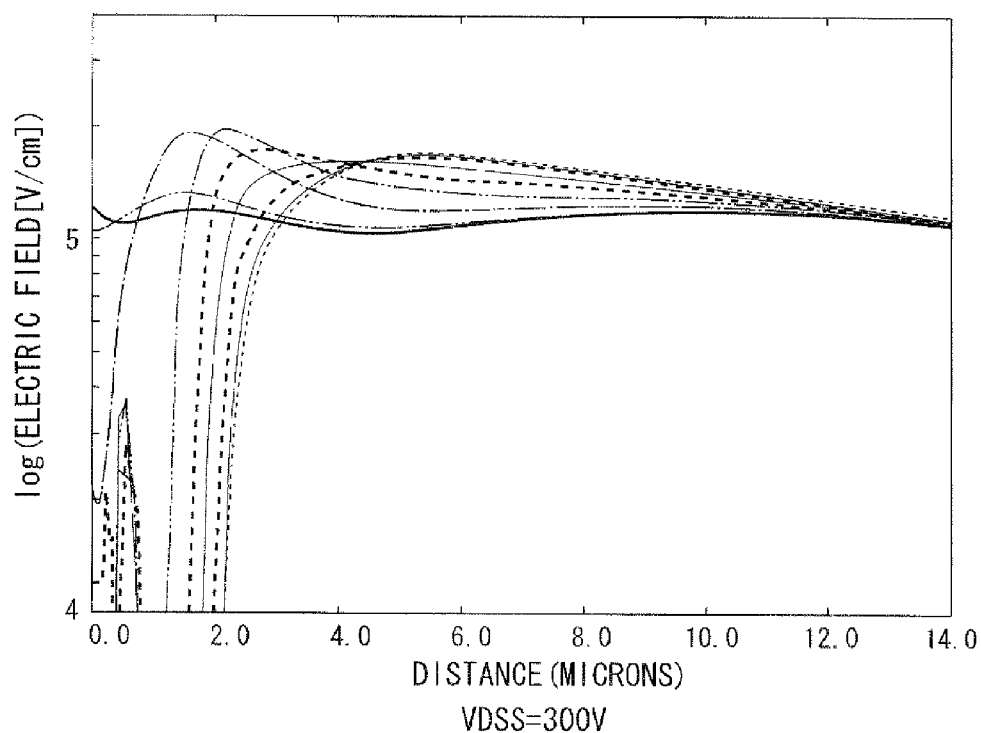
FIG. 24B is a graph showing field strength at an output point shown in FIG. 21 when the reverse bias (300 V) is applied.

FIGS. 24A and 24B are graphs showing an extension state and field strength of the depletion layer when a reverse bias of VDSS=300 V is applied. The portion corresponding to the maximum field strength is not at the edge portion of the P layer (base regions 7a and 7b) in the N layer (reference concentration layer 4), but shifts to the bottom portion of the P layer (the base regions 7a and 7b) at the junction between the P layer (base regions 7a and 7b) and the P– layer (depletion-layer extension regions 6a and 6b). As shown in FIGS. 24A and 24B, the field strength at the lower portion of the diffusion layer of the P layer (base regions 7a and 7b) becomes high to a similar extent to that of the edge portion. However, compared with the conventional structure shown in FIG. 15B, it is understood that the field strength of the lower portion of the diffusion layer of the P layer (base regions 7a and 7b) is substantially equal to that of the edge portion of the P layer (base regions 7a and 7b) in the N layer (reference concentration layer 4) in the present embodiment. At the edge portion of the P layer (base regions 7a and 7b) in the N layer (reference concentration layer 4), the depletion layer extending from the P layer (base region 7a) and the depletion layer extending from the opposing P layer (base region 7b) are connected and the width of the connected depletion layer is wide, and therefore an increase in the field strength is considered to be prevented. Further, the field strength of the P+ layer (second base region) protrudes and becomes high in the conventional case, while the field strength of the P– layer (depletion-layer extension regions 6a and 6b) is low and in a dull shape in the present embodiment.

Figure 25A:
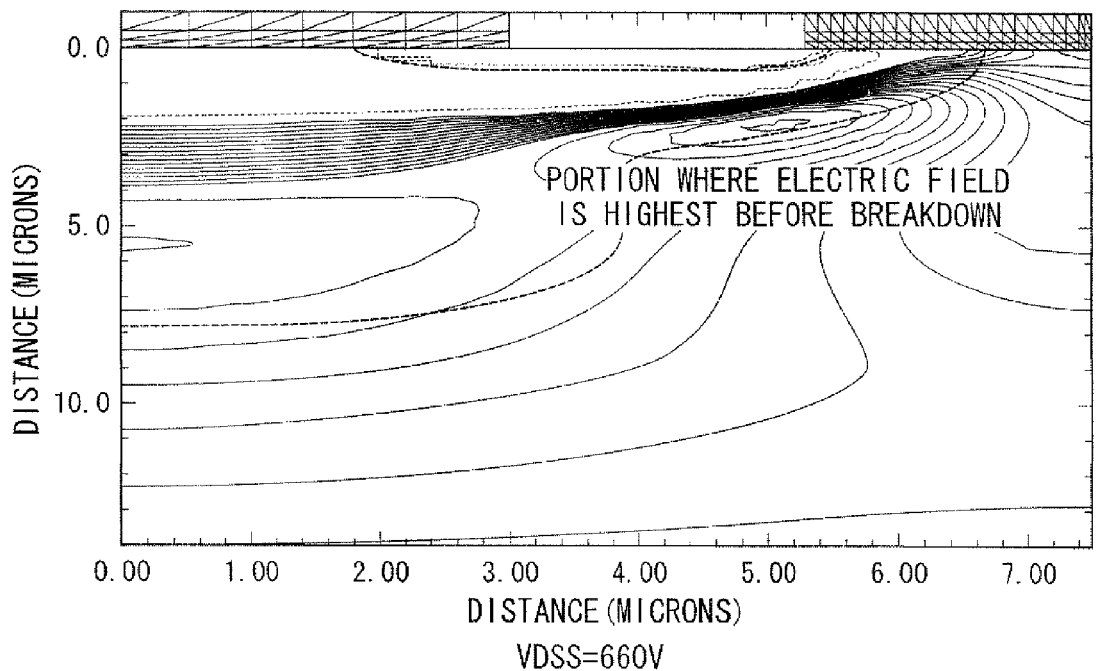
FIG. 25A is a graph showing field strength at an output point shown in FIG. 21 when a reverse bias (660 V) is applied.
Figure 25B:
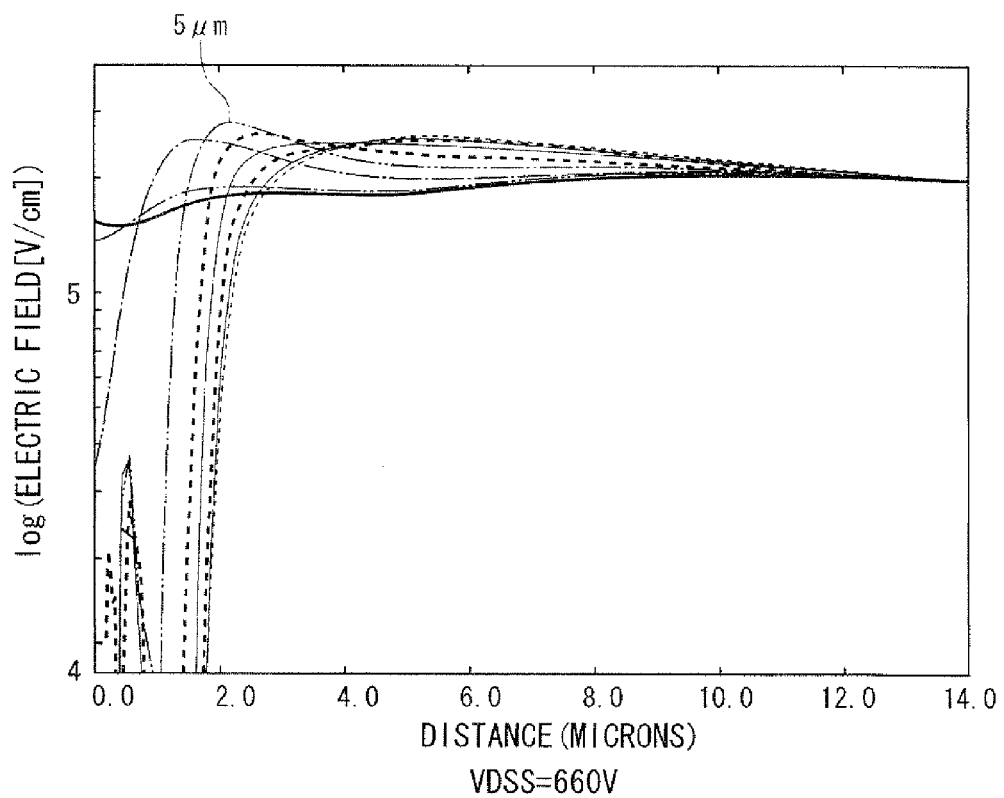
FIG. 25B is a graph showing field strength at an output point shown in FIG. 21 when the reverse bias (660 V) is applied.

FIGS. 25A and 25B are graphs showing an extension state and field strength of the depletion layer when a reverse bias of VDSS=660 V close to the withstand voltage is applied. As shown in FIG. 25A, the field strength at the lower portion of the diffusion layer in the P layer is high compared with the other portions as continued from the state of FIG. 24. The value of the field strength is shown in FIG. 25B.

As shown in FIGS. 16A and 16B, the withstand voltage is determined by the increase in the field strength at the junction between the P+ layers (second base regions) and the reference concentration layer in the conventional structure. Meanwhile, the boundary between the P– layer (depletion-layer extension regions 6a and 6b) and the N– layer is included in the present embodiment so that depletion layers bi-directionally extend from the boundary between the P– layer and the N– layer to lower the field strength at the junction between the P– layer and the reference concentration layer. Further, in the present embodiment compared with the conventional structure, the field concentration can be relaxed by the depletion layer extending more widely on the P– layer (depletion-layer extension regions 6a and 6b) side. As a result, the protruding portion corresponding to the field concentration in the P+ layer (second base layer) in the conventional structure is reduced, the gentle field strength distribution is attained, the field strength is substantially identical to those of other portions, and thereby the withstand voltage of the semiconductor device can be enhanced. As understood from FIG. 25B, the structure of the present embodiment has no portion having outstandingly high field strength, and thereby the entire withstand voltage is enhanced.

Figure 26:
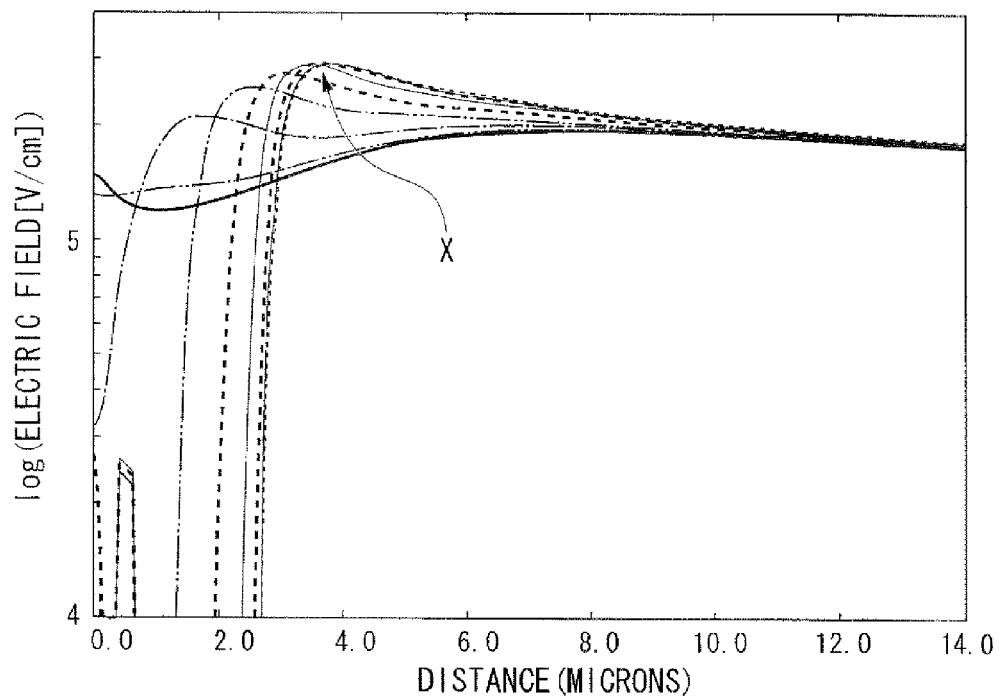
FIG. 26 is a graph showing field strength at a PN junction of each portion when a reverse bias (610 V) is applied in the conventional case.

In other words, in the case of the conventional structure as explained in the simulation result shown in FIGS. 13A and 13B to 16A and 16B, as shown in FIG. 26, the field strength becomes high in the vicinity of the boundary in the P+ region (second base region), a breakdown eventually occurs in the vicinity of the boundary, and the withstand voltage is determined. As for FIG. 26, the vertical axis represents the field strength and the horizontal axis represents the distance in the depth direction corresponding to the vertical axis shown in each FIG. 13A to 16A. Reference character X indicates that the electric field becomes high in the second base having the higher concentration and the deeper depth and a breakdown occurs (a voltage is determined) in the ease o the conventional case.

Figure 27:
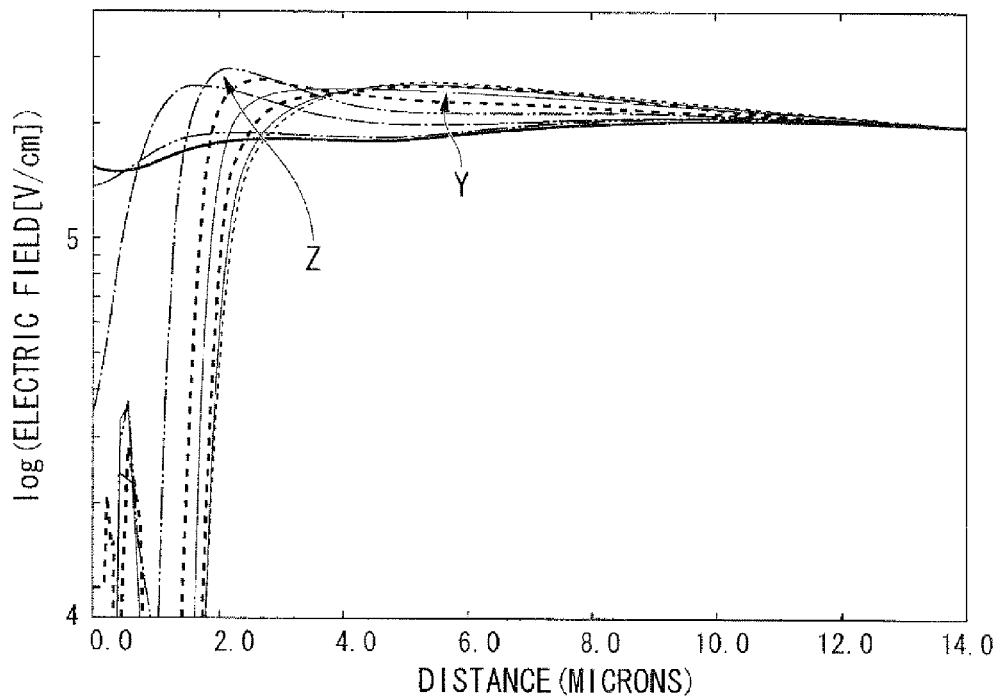
FIG. 27 is a graph showing field strength at a PN junction of each portion when a reverse bias (660 V) is applied in the present embodiment.

On the other hand, in the case of the present embodiment as explained above, the P– layer (depletion-layer extension regions 6a and 6b) is thicker than the P+ layer (second base region) in the conventional structure and directly connects to the N– layer. As a result, the field strength is relaxed in the vicinity of the boundary between the P– layer and the P layer in the present embodiment since the distance from the P– layer to the P layer by which the depletion layer extends from the boundary between the P– layer and the N– layer is longer than that in the conventional structure. Since the field strength at any PN conjunction continues equally according to an increase in the reverse bias voltage as shown in FIG. 27, the withstand voltage of the entire semiconductor device increases. As for FIG. 27, the vertical axis represents field strength, the horizontal axis represents the distance in the depth direction corresponding to the vertical axis shown in FIG. A of each FIGS. 22 to 25, and a reference numeral represents the position corresponding to the distance indicated by the horizontal axis shown in FIG. 21. Reference character Y indicates that a gentle and high field distribution can be attained to a deep portion since the depletion-laver extension region (second base)has the lower concentration and the deeper depth than the first base in the case of the present invention, and that a higher withstand voltage can he achieved since the area of the field and the distance is equal to the voltage. Reference character Z indicates that the next high portion appears when this electric field of the second base is relaxed and the voltage becomes higher and that the electric field of the first base becomes hihg and a breakdown occurs (a voltage is determined).

Although explanation has been given showing examples of the size, concentration, ion injection conditions, an ion injection sequence, a diffusion sequence, an impurity, and the like in the embodiment, it is not limited thereto. Various modifications can be made as long as the similar effect to the present invention can be achieved.

Although the case where the first conductive type is the n-type and the second conductive type is the p-type is explained in the embodiment, it is not limited thereto. The present invention is applicable to a semiconductor device in which the first conductive type is the p-type and the second conductive type is the n-type.

Although the case where the semiconductor device of the present invention has the MOSFET structure, it is not limited thereto. For example, the present invention is applicable to a semiconductor device called IGBT including a Schottky junction and a p-type impurity on the drain electrode side.

The invention claimed is:

1. A semiconductor device including a plurality of units having identical structures, each of which comprising:
   a drain electrode;
   a drift layer that includes a low concentration layer on the drain electrode and a reference concentration layer on the low concentration layer,
   the reference concentration layer including an impurity of a first conductive type at a first concentration, and
   the low concentration layer including an impurity of the first conductive type at a concentration lower than the first concentration;
   a gate electrode on the reference concentration layer;
   a pair of source regions that are provided on an upper surface of the reference concentration layer and in the vicinity of both ends of the gate electrode, and include an impurity of the first conductive type at a concentration higher than the first concentration;
   a pair of base regions that surround outer surfaces of the source regions and include an impurity of a second conductive type at a second concentration;
   a source electrode electrically connected to the source regions and the base regions; and a pair of depletion-layer extension regions that are provided under the base regions in the reference concentration layer and include an impurity of the second conductive type at a concentration lower than the second concentration, wherein
   first boundaries between the depletion-layer extension regions and the low concentration layer are positioned lower than a second boundary between the reference concentration layer and the low concentration layer.

2. The semiconductor device according to claim 1, wherein a depth between the upper surface of the reference concentration layer and lower surfaces of the depletion-layer extension regions is more than twice that between the upper surface of the reference concentration layer and lower surfaces of the base regions.

3. The semiconductor device according to claim 1, wherein the depletion-layer extension regions contact with respective flat portions of the lower surfaces of the base regions.

4. The semiconductor device according to claim 1, wherein the source regions are spaced symmetrically with respect to a widthwise center of each unit,
   the base regions are spaced symmetrically with respect to the widthwise center, and when a reverse voltage applied between the source electrode and the drain electrode increases,
   a pair of first depletion layers extends from third boundaries between the based regions and the reference concentration layer and connects each other at the widthwise center, and
   a pair of second depletion layers extends from fourth boundaries between the depletion-layer extension regions and the reference concentration layer and connects each other at the widthwise center.

5. The semiconductor device according to claim 4, wherein a pair of third depletion layers upwardly and downwardly extends from the first boundaries upon the first depletion layers and the second depletion layers extending when the reverse bias applied between the source electrode and the drain electrode increases, and
   a connection of the first depletion layer and a connection of the second depletion layers occur before the third depletion layers reach the source region or the drain region.

6. The semiconductor device according to claim 5, wherein the base regions, the depletion-layer extension regions, the reference concentration layer, and the low concentration layer are formed with thicknesses and impurity concentrations such that the field strength in each depletion layer is substantially identical until the field strength of each PN junction corresponding to each depletion layer becomes a value at which a breakdown occurs.

7. The semiconductor device according to claim 4, wherein each of the fourth boundaries is positioned in the vicinity of a reference position that is a midpoint between the widthwise center and a unit-boundary between the unit and an adjacent unit.

8. The semiconductor device according to claim 7, wherein each of the fourth boundaries are positioned on the side of the widthwise center with respect to the reference position, and each of the first boundaries are positioned on the side of the unit-boundary with respect to the reference position.

9. The semiconductor device according to claim 7, wherein upper fourth boundaries are parallel to each other and lower fourth boundaries are curved.

* * * * *